(12) United States Patent
Ingalsbe et al.

(10) Patent No.: US 6,803,769 B2
(45) Date of Patent: Oct. 12, 2004

(54) CABLE CONTINUITY TEST SYSTEM

(75) Inventors: David L. Ingalsbe, Paynesville, MN (US); Jeffrey A. Deming, Belgrade, MN (US); Donovan L. Isdahl, Brooten, MN (US)

(73) Assignee: Independent Technologies, Inc., Omaha, NE (US)

( * ) Notice: Subject to any disclaimer, the term of this patent is extended or adjusted under 35 U.S.C. 154(b) by 0 days.

(21) Appl. No.: 10/177,582

(22) Filed: Jun. 19, 2002

(65) Prior Publication Data

US 2003/0107383 A1 Jun. 12, 2003

Related U.S. Application Data

(63) Continuation of application No. 09/663,916, filed on Sep. 18, 2000, now abandoned.
(60) Provisional application No. 60/154,753, filed on Sep. 17, 1999.

(51) Int. Cl.[7] .................................................. H04B 3/46
(52) U.S. Cl. ...................................................... 324/539
(58) Field of Search ................................ 324/543, 542, 324/508, 555, 539, 66; 379/21, 26.01, 26.02

(56) References Cited

U.S. PATENT DOCUMENTS

| | | | |
|---|---|---|---|
| 4,257,002 A | * | 3/1981 | Helms et al. .................. 324/66 |
| 4,575,588 A | | 3/1986 | Vande Vyver |
| 4,596,904 A | | 6/1986 | Messenger |
| 4,703,497 A | | 10/1987 | Ingalsbe |
| 5,228,072 A | | 7/1993 | Ingalsbe et al. |
| 5,598,342 A | * | 1/1997 | Siemon et al. ............... 364/481 |
| 6,026,145 A | * | 2/2000 | Bauer et al. ................... 379/26 |

OTHER PUBLICATIONS

Inependent Technologies, Inc., Test–All IV Plus, Brochure, 2 pages.

Jeffrey A. Deming, Test–All IV Plus, System Overview, Sep. 2, 1999, 12 pages, Independent Technologies, Inc.

Independent Technologies Inc., Test–All IV Plus, User's Manual, 1999, 27 pages, Independent Technologies, Inc., Omaha, NE.

Overview of Test–All Iv Plus Data Manager Software, Article, 2 pages.

Independent Technologies, Inc., Test–All IV Plus, Schematic, 7 pages, Jul. 30, 1999.

Independent Technologies, Inc., Test–All IV Plus Programmable Terminator, Schematic, 1 page, Jul. 30, 1999.

Independent Technologies, Inc., Test–All IV Plus Battery Pack, Schematic, 1 page, Jul. 13, 1999.

Independent Technologies, Inc., Test All IV Plus Data, User's Guide, 14 pages, Apr., 1999, Independent Technologies, Inc., Omaha, NE.

* cited by examiner

*Primary Examiner*—N. Le
*Assistant Examiner*—Amy He
(74) *Attorney, Agent, or Firm*—Skinner and Associates

(57) ABSTRACT

A cable continuity test system, comprising a terminator unit electrically connected to a first side of a cable to be tested, and a test set unit electrically connected to a first side of the cable. The test set unit includes a display and further includes a microprocessor adapted for performing standard continuity tests. The test unit stores records for each site tested with a time and date stamp. The terminator unit is a programmable unit, and preferably is capable of being programmed with a unique terminator ID between the numbers of 00 and 99.

11 Claims, 73 Drawing Sheets

| FIG. 5A |
|---|
| FIG. 5B |
| FIG. 5C |
| FIG. 5D |
| FIG. 5E |
| FIG. 5F |

FIG. 5

| FIG. 5A-1 |
|---|
| FIG. 5A-2 |
| FIG. 5A-3 |
| FIG. 5A-4 |
| FIG. 5A-5 |

| FIG. 6A-1 |
|---|
| FIG. 6A-2 |
| FIG. 6A-3 |
| FIG. 6A-4 |
| FIG. 6A-5 |
| FIG. 6A-6 |
| FIG. 6A-7 |
| FIG. 6A-8 |
| FIG. 6A-9 |
| FIG. 6A-10 |
| FIG. 6A-11 |

| FIG. 7A |
|---------|
| FIG. 7B |
| FIG. 7C |
| FIG. 7D |
| FIG. 7E |
| FIG. 7F |

FIG. 7

| FIG. 8A |
|---------|
| FIG. 8B |
| FIG. 8C |
| FIG. 8D |
| FIG. 8E |
| FIG. 8F |

FIG. 8

| FIG. 9A |
|---|
| FIG. 9B |

CABLE CONTINUITY TEST SYSTEM

CROSS-REFERENCE TO RELATED APPLICATIONS, IF ANY

This application is a continuation of U.S. patent application Ser. No. 09/663,916, filed Sep. 18, 2000 now abandoned, which claims the benefit under 35 U. S.C. §119(e) of co-pending U.S. Provisional Patent Application Ser. No. 60/154,753, filed Sept. 17, 1999, both of which are hereby incorporated by reference.

37 C.F.R. §1.71(e) AUTHORIZATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

STATEMENT REGARDING FEDERALLY SPONSORED RESEARCH OR DEVELOPMENT

Not applicable.

Not applicable.

REFERENCE TO A MICROFICHE APPENDIX, IF ANY

Not applicable.

BACKGROUND OF THE INVENTION

1. Field of the Invention

The present invention relates, generally, to telecommunications. More particularly, the invention relates to systems, including apparatus and methods, for testing the continuity of telecommunication cables. The invention has particular utility in performing standard continuity tests on four-pair copper cables.

2. Background Information

The state of the art includes a number of devices and methods for testing the continuity of telecommunication cables. Some of these devices and methods are illustrated by the Four Pair Cable Test Set and the known art described in U.S. Pat. No. 4,703,497, which is assigned to Applicants' assignee and is hereby incorporated by reference as Appendix H.

The present invention provides a cable continuity test system which is believed to constitute an improvement over the known art.

BRIEF SUMMARY OF THE INVENTION

The present invention provides a cable continuity test system which generally comprises a test set unit and at least one programmable terminator unit. The system preferably tests cables extending from a closet to a workstation or station. Each terminator is connected to the opposite end of the cable being tested. The two units establish a communications link if any two conductors have continuity from the closet end to the station end of the cable. Testing begins after a communication link is established.

The cable continuity test system is completely automatic and can, for example, perform a complete standard continuity test of a single four-pair cable in approximately one second. The system detects a live line, i.e. power on any two conductors, and also detects opens, shorts, reversals, crosses, and split pairs. Additionally, the system can detect the wiremap configuration on the workstation end of the cable. The test results can be viewed on several different test result screens and can be stored in memory for later retrieval.

The system includes a number of setup and operating features. With respect to setting a cable continuity test system, the present invention includes the following features: locating tone; site name or location; wiremap for station end; the test end may be either the closet or the station end; a cable view perspective from either the closet end, the station end, or both ends; a clock time and date; add sites (names) from personal computer or menu; beeper control; and an automatic power down timer on/off control. With respect to testing a cable, the present invention includes the following features: data about the cable can be displayed in a text mode, in a graphic mode, or in a simple pass/fail mode.

The system preferably further includes a menu-driven software within the test set unit which allows a user to test and save a number of sites, to select a station wiremap, to select the test set end, to select a cable view, and to select tone generation for wire location.

When a cable is tested, the system may display the status of each conductor in the cable. Possible status displays include: (1) OK: Pair contains no miswires; (2) OPEN: Tip and Ring of that pair are both open; (3) SHORTED: Tip and Ring of that pair are shorted; (4) REVERSED: Tip and Ring of that pair are reversed; (5) CROSSED: Pair is crossed with a second pair; (6) SPLIT: Pair is split with a second pair; (7) T OPEN: Tip of that pair is open; (8) R OPEN: Ring of that pair is open; (9) T SHORT: Tip of that pair is shorted; (10) R SHORT: Ring of that pair is shorted; (11) T CROSS: Tip of that pair is crossed or transposed; and (12) R CROSS: Ring of that pair is crossed or transposed. The data for each site is stored in the test set unit, may be uploaded into a data manager in a personal computer, and may be processed into reports and other usable information using the software data manager, and may be archived.

Significant features of the invention include the use of one or more programmable terminator units, each of which include an auto power-up and a current detection method. The test set unit is field upgradable, is capable of storing and retrieving records for a number of different sites, reduces the effects of line capacitance by using a current source for communication, displays a variety of cable views, detects split pairs, is capable of testing from either end of the cable without additional adaptive hardware, and is capable of uploading records to a personal computer. The PC Software Data Manager provides various three dimensional cable views, and a record printouts for documenting the results of the continuity tests, identifies a variety of wire mappings including T568A, T568B, USOC 3, USOC 4,10 BASE-T and TOKEN RING, and stores records for archives.

The features, benefits and objects of this invention will become clear to those skilled in the art by reference to the following description, claim(s), if any, and drawings.

DETAILED DESCRIPTION

Figure 1:
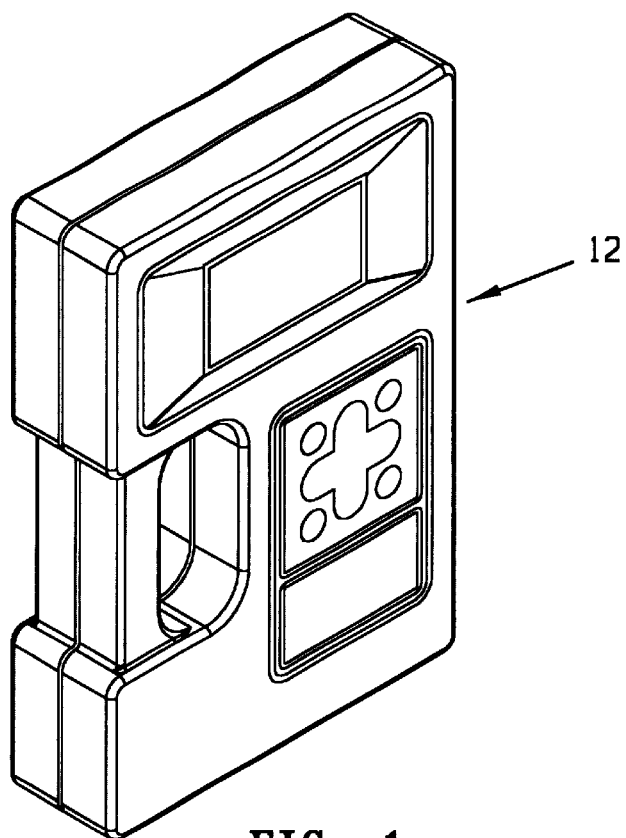
FIG. 1 is a perspective view of the test set unit of the cable continuity test system of the present invention.
Figure 2:
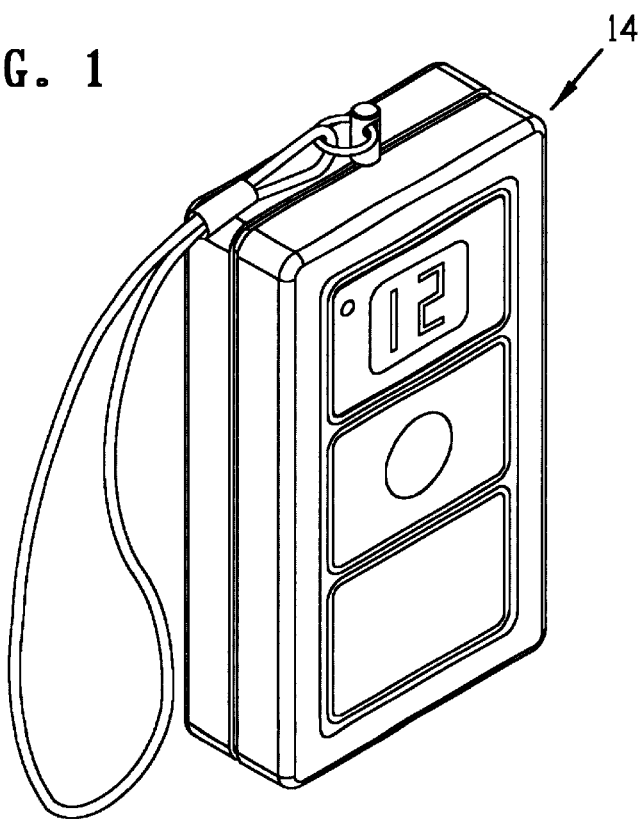
FIG. 2 is perspective view of the programmable terminator unit of the cable continuity test system of the present invention.
Figure 3:
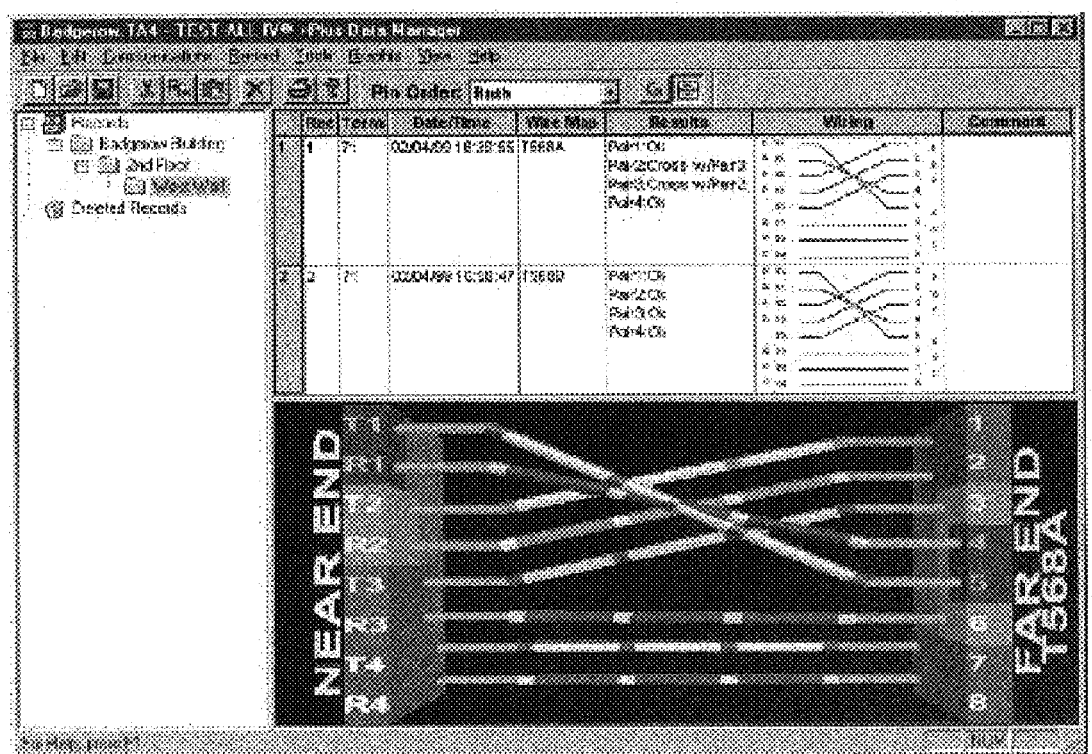
FIG. 3 is a screen capture of the user interface for the personal computer data manager software of the cable continuity test system of the present invention.
Figure 4A:
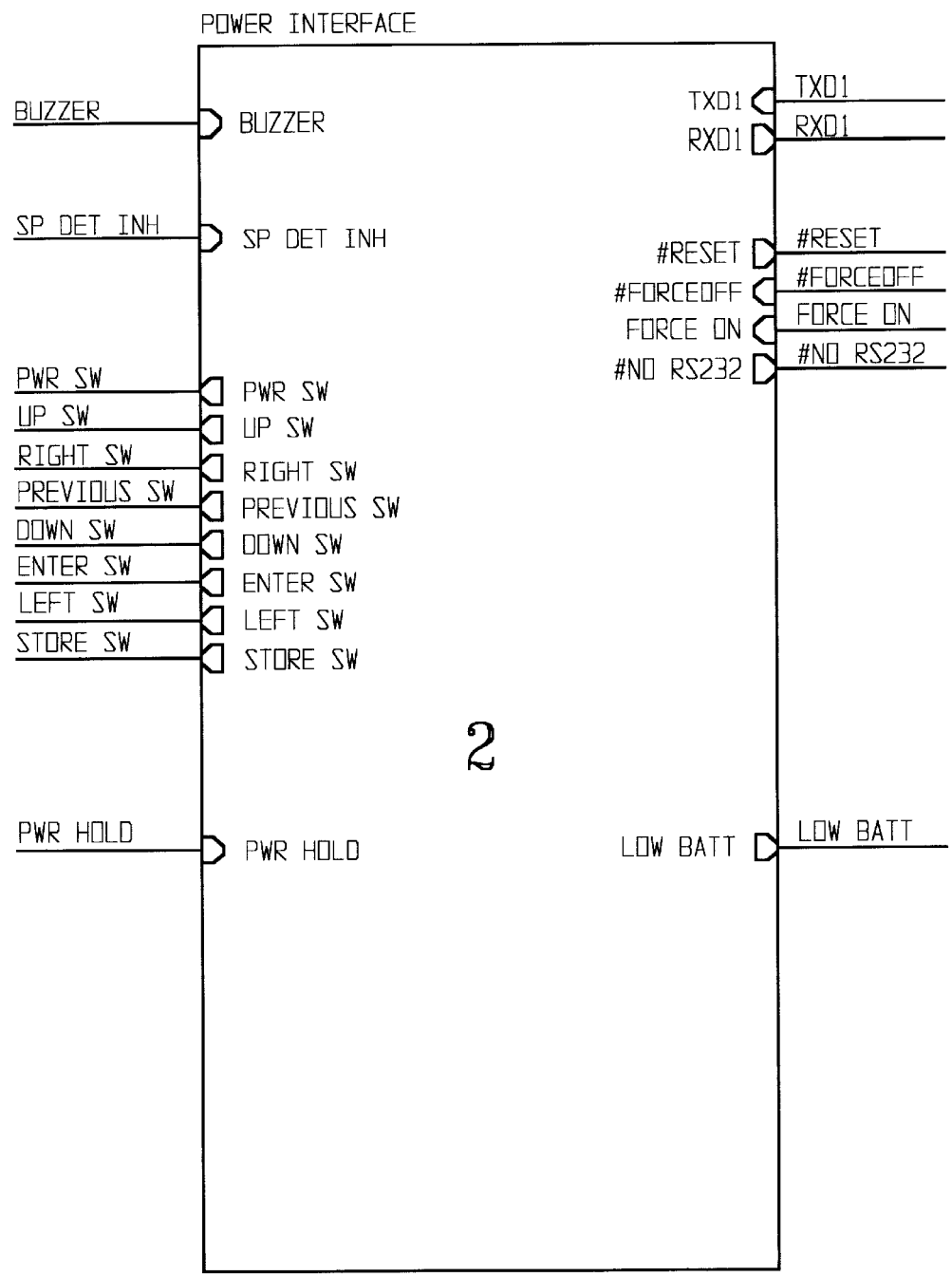
FIG. 4 is a block-type electrical schematic of the test unit.
Figure 4B:
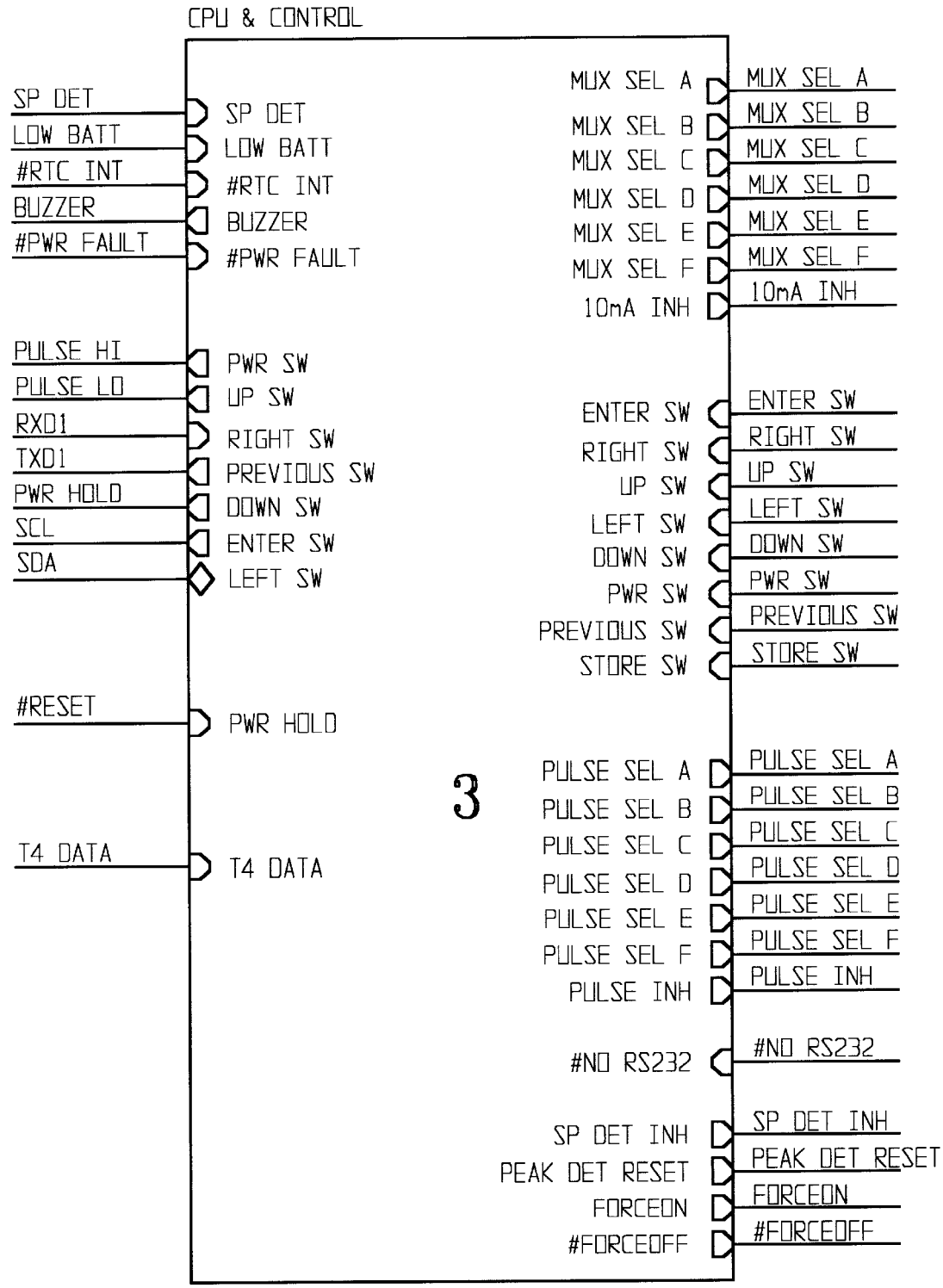
Figure 4C:
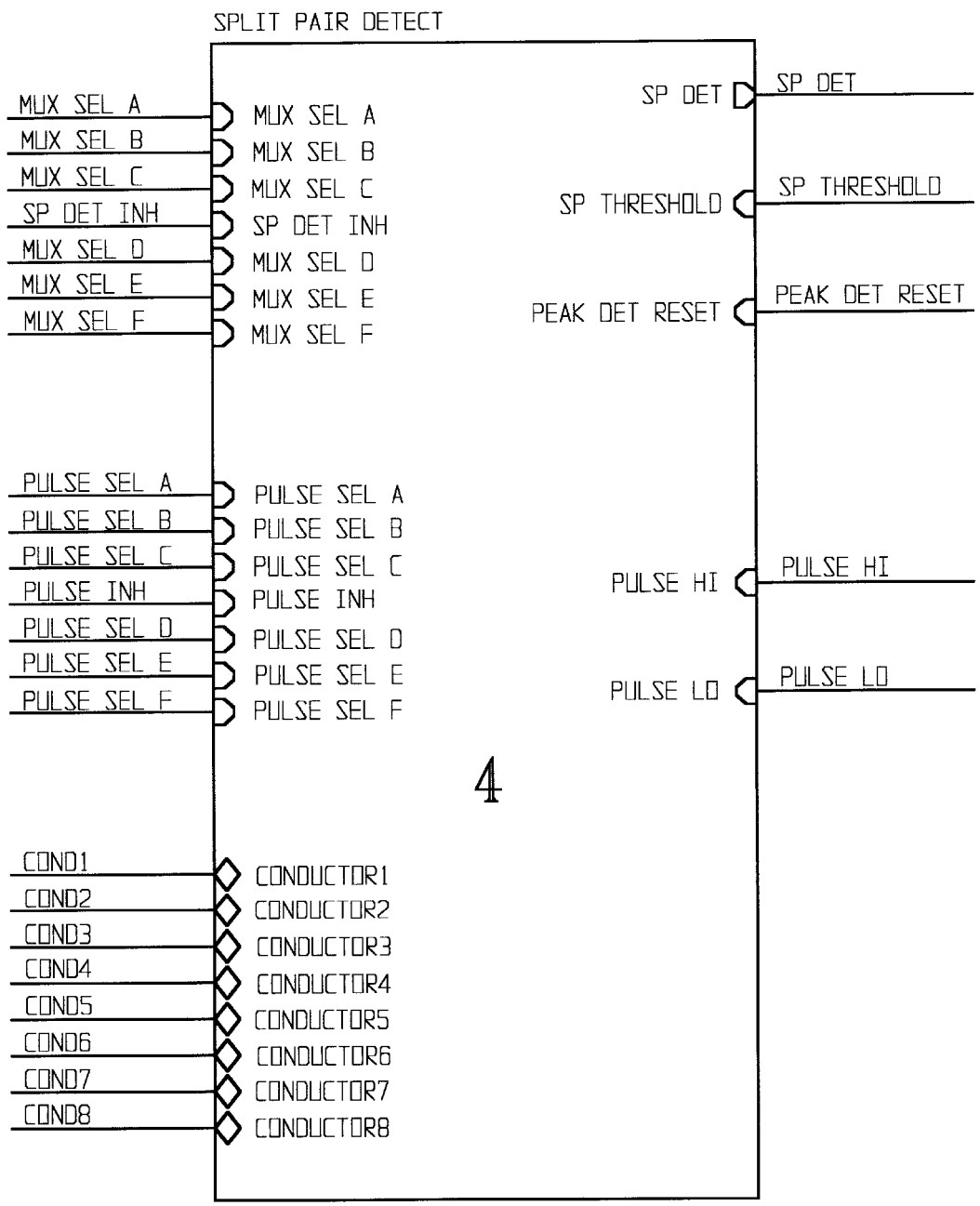
Figure 4D:
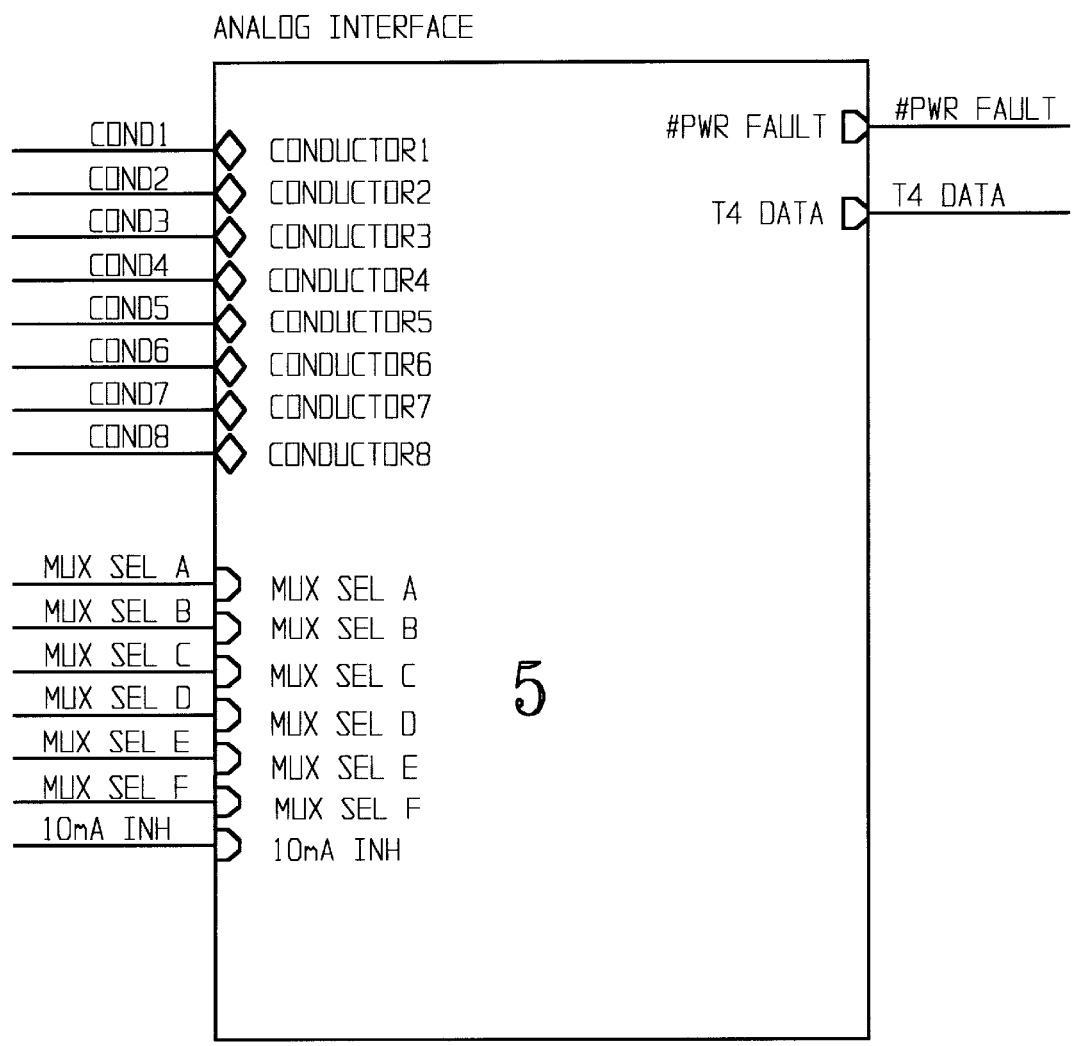
Figure 4E:
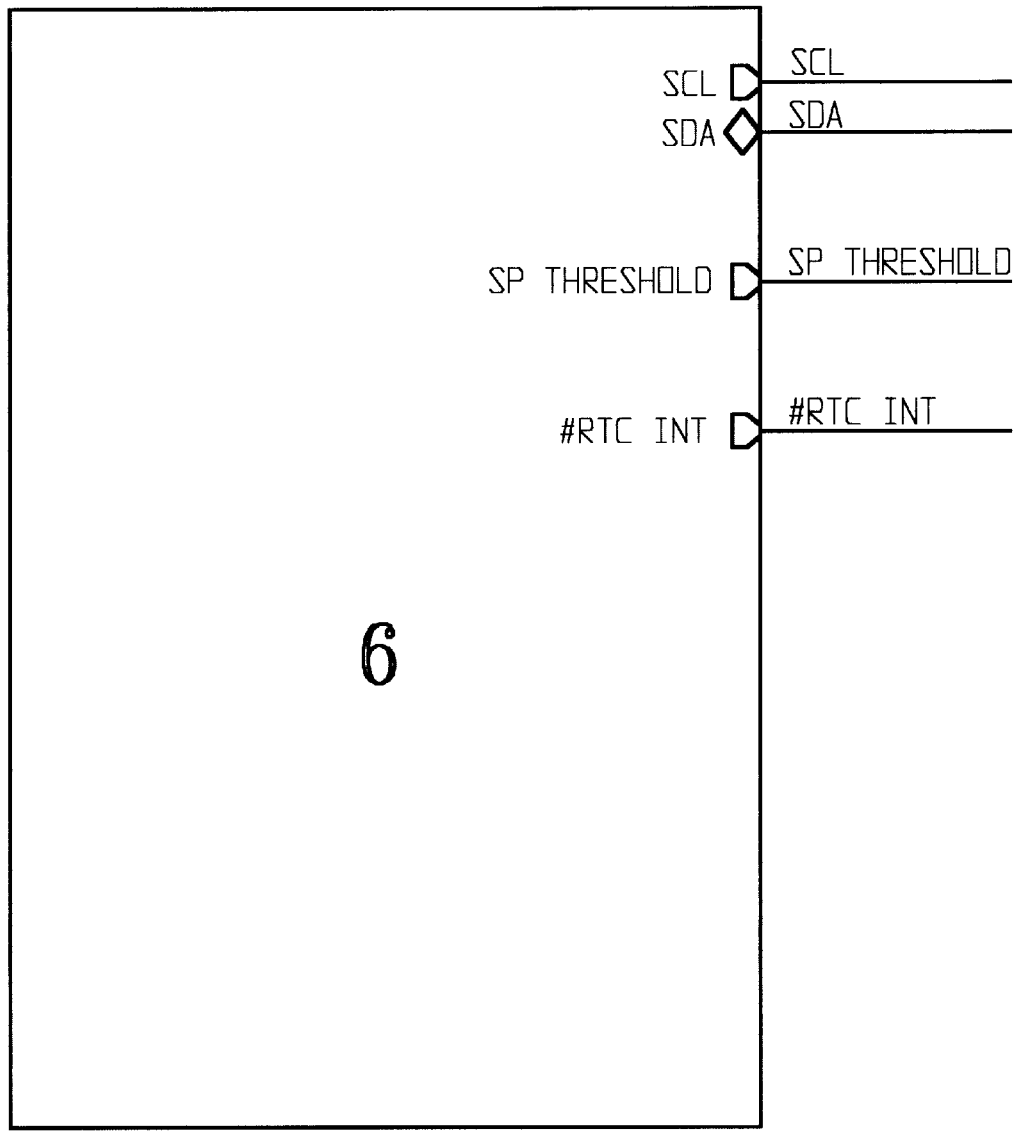
Figures 1, 5A:
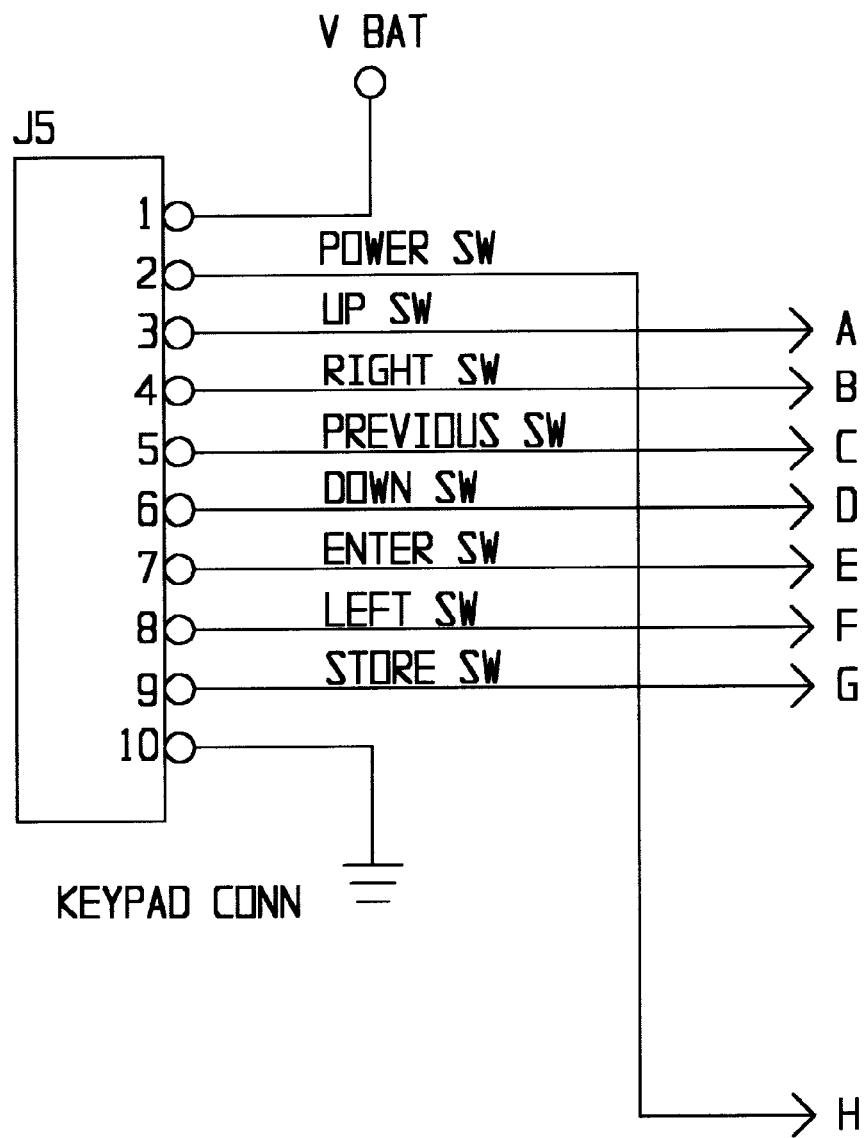
Figures 2, 5A:
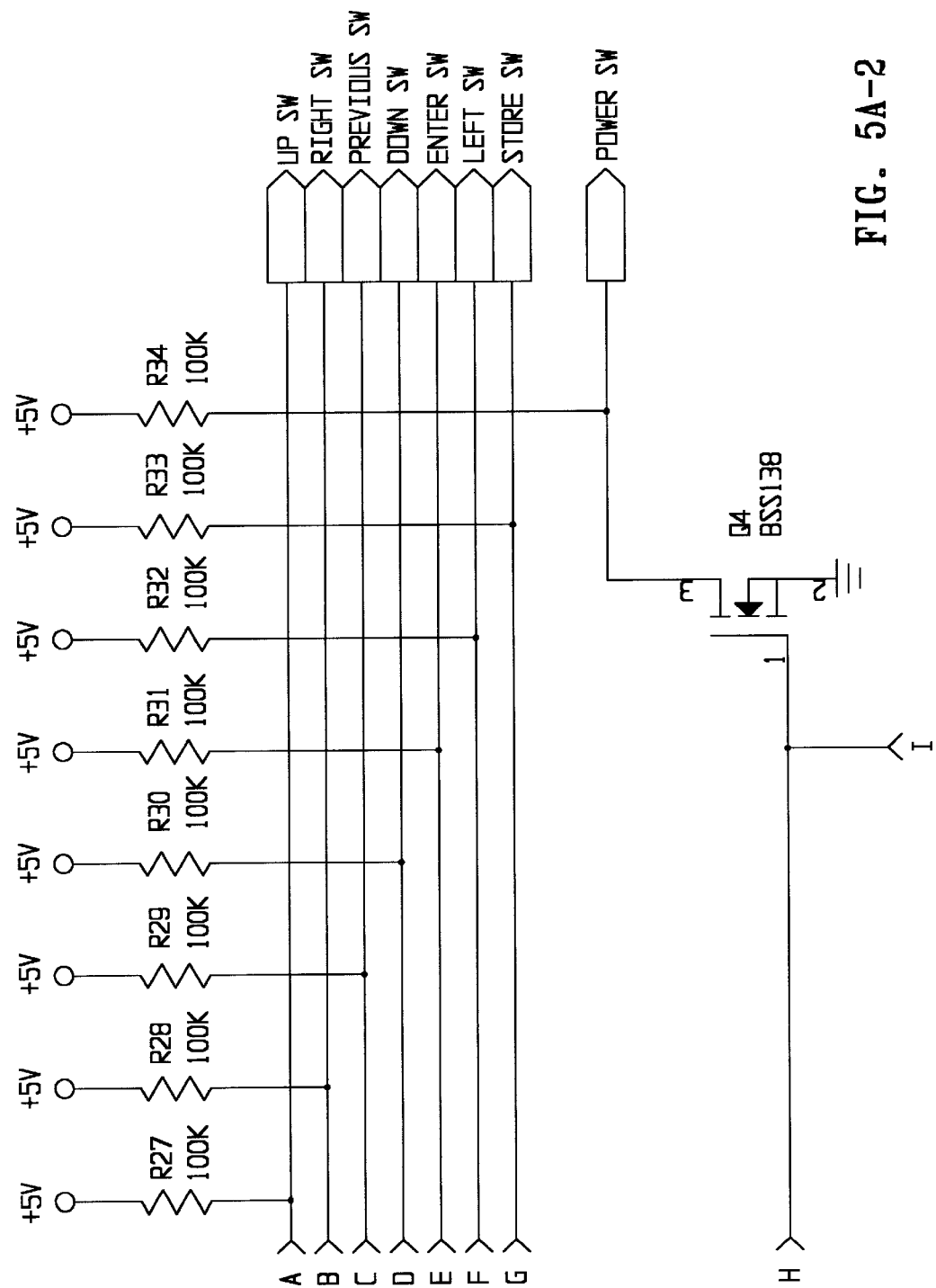
Figures 3, 5A:
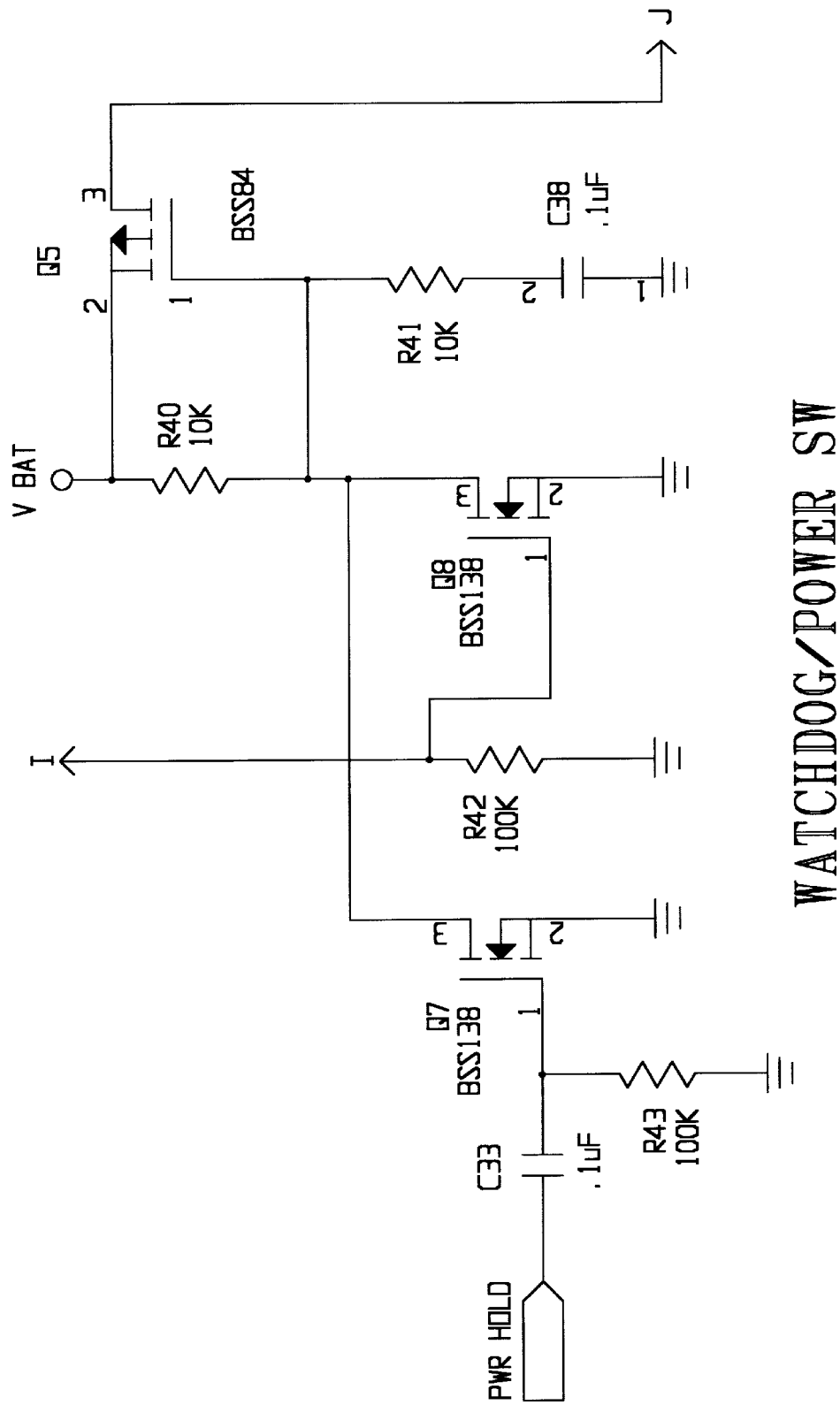
Figures 4, 5A:
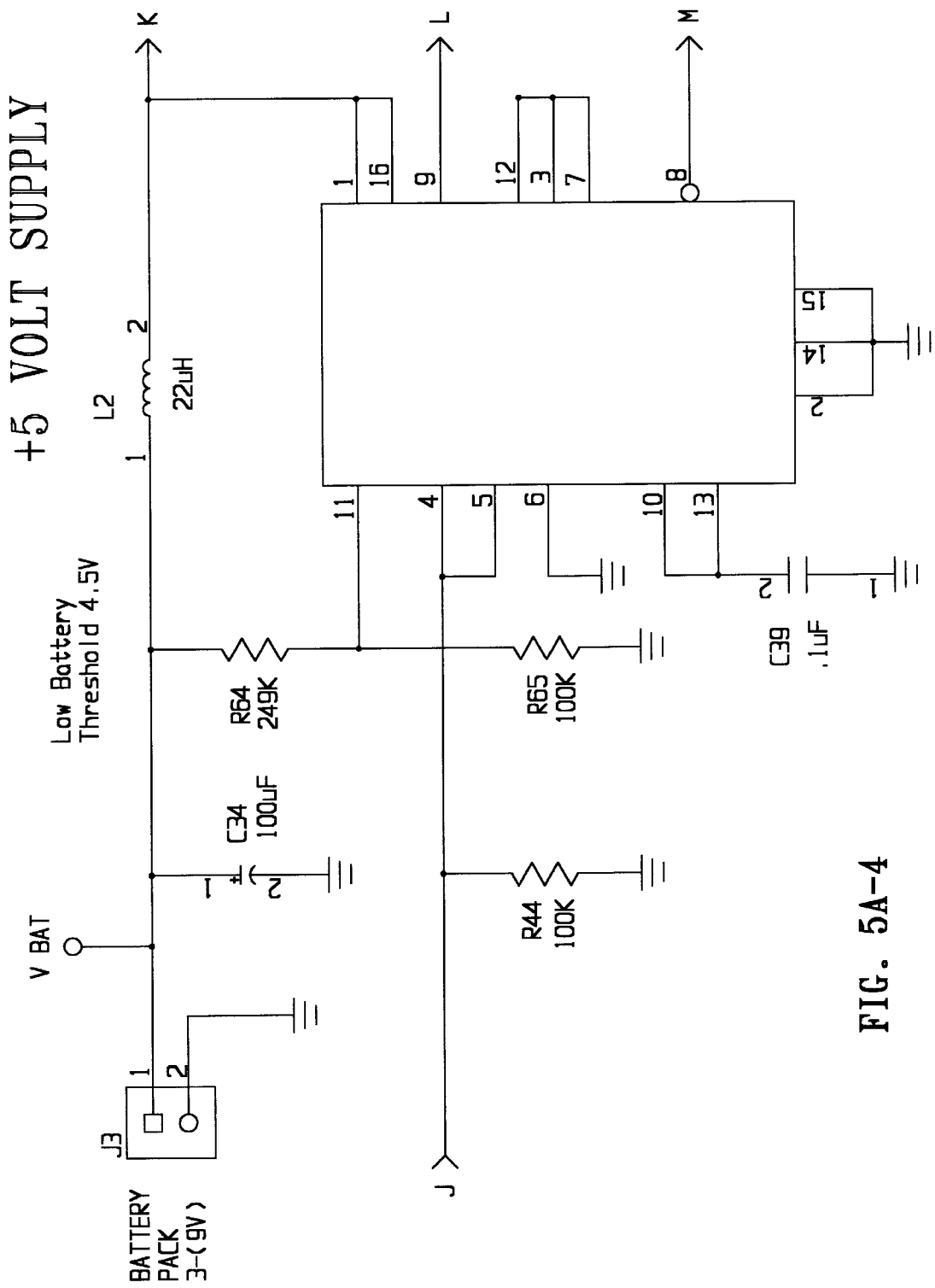
Figures 5, 5A:
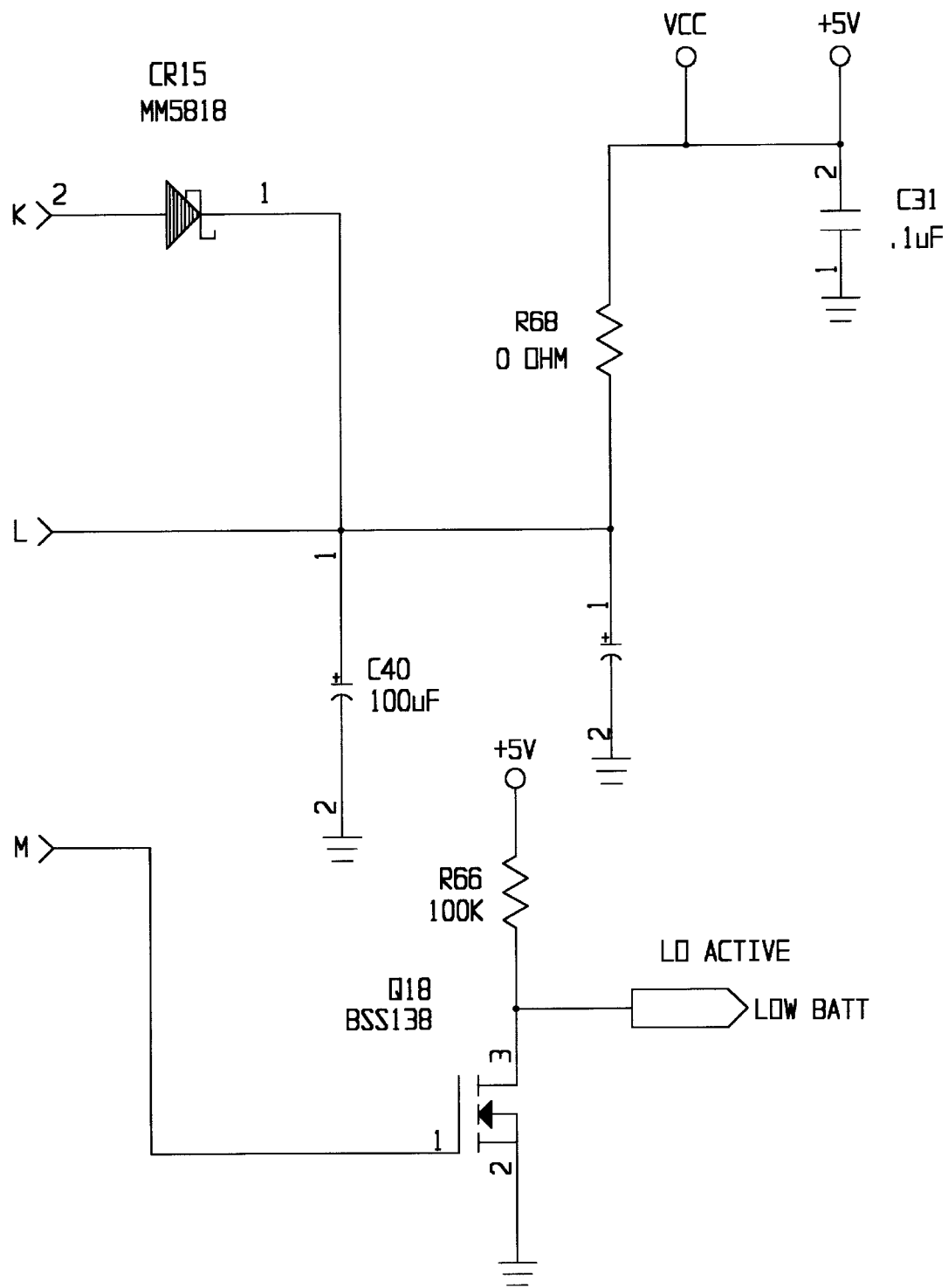
FIG. 5 is an electrical schematic of the Power Interface (Block 2) of FIG. 4.
Figure 5B:
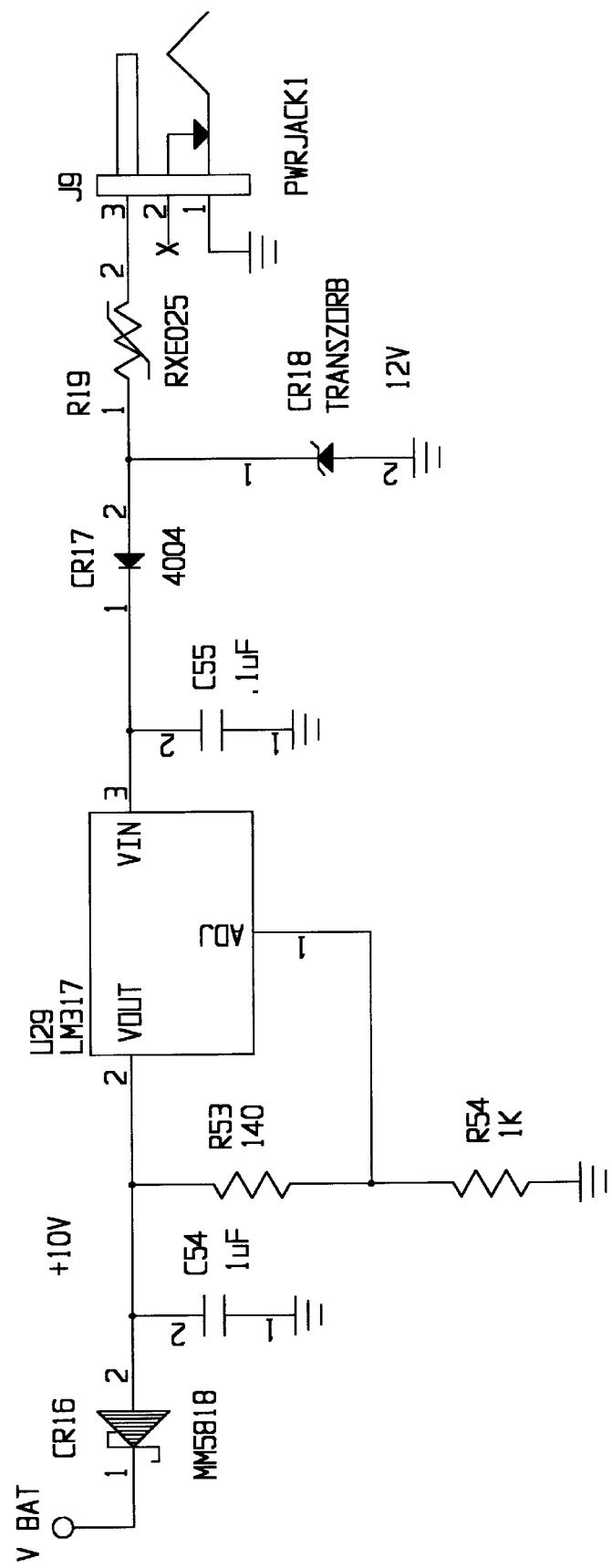
Figure 5C:
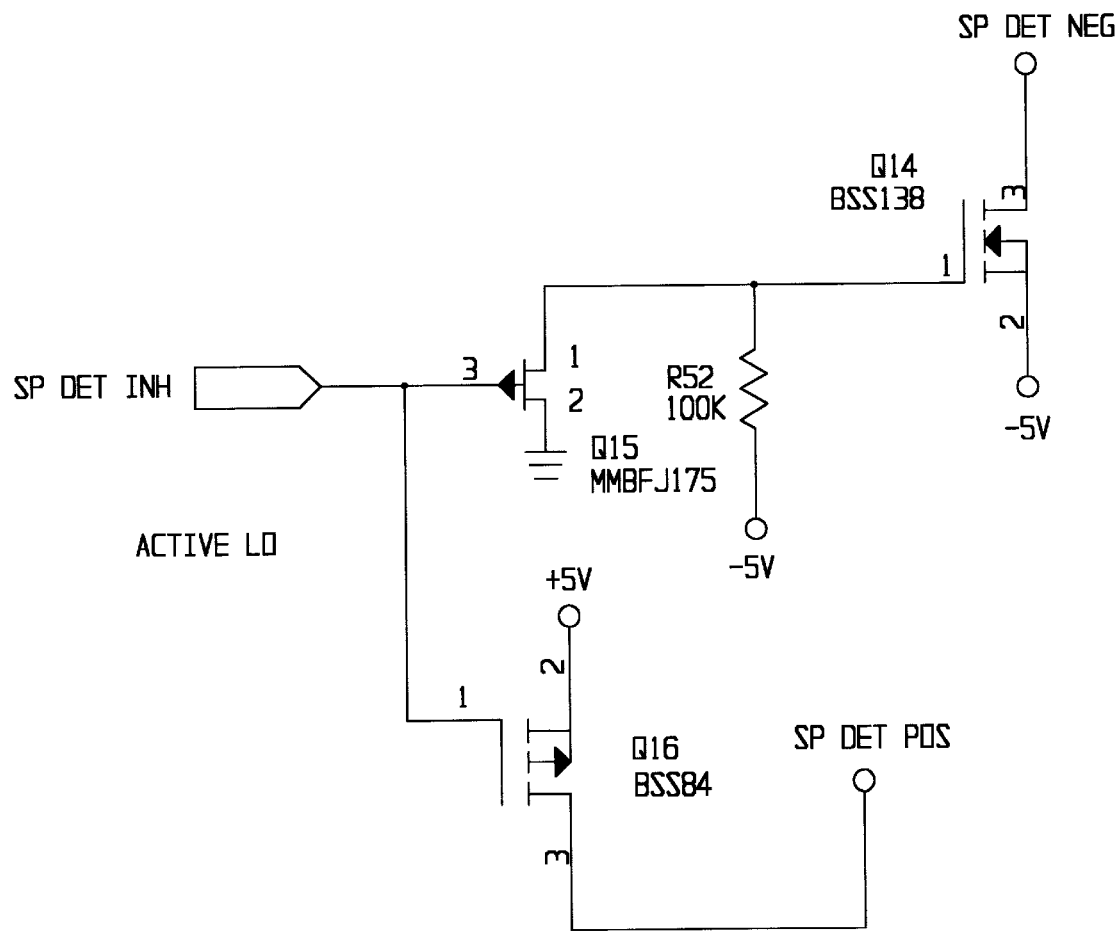
Figure 5D:
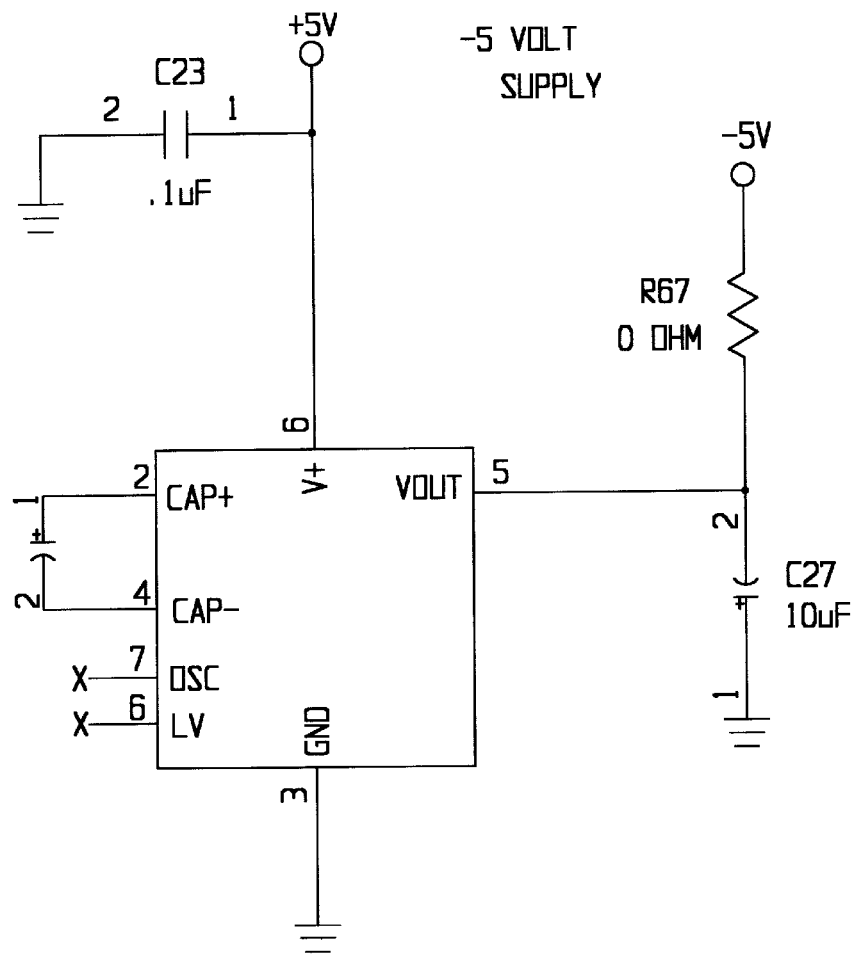
Figure 5E:
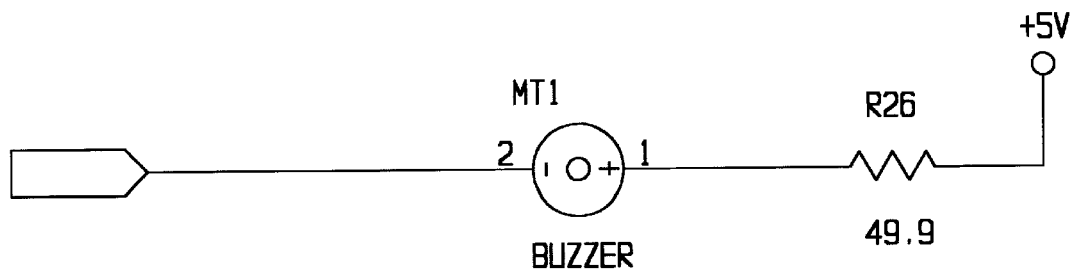
Figures 1, 5F:
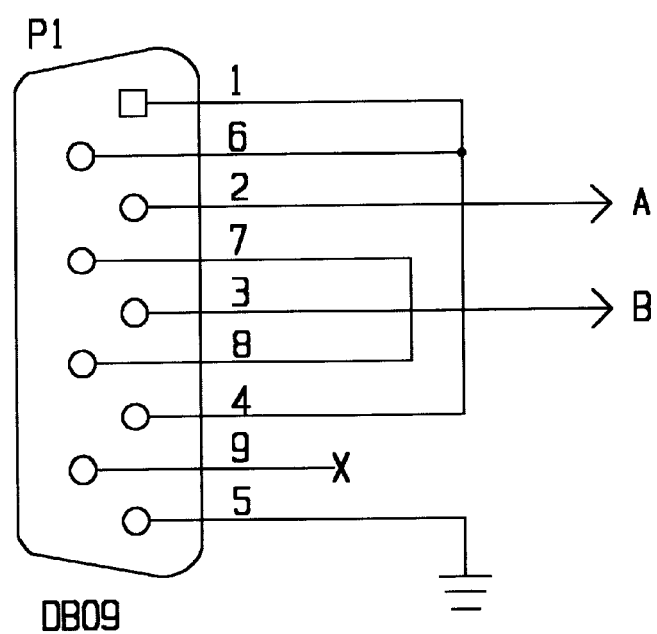
Figures 2, 5F:
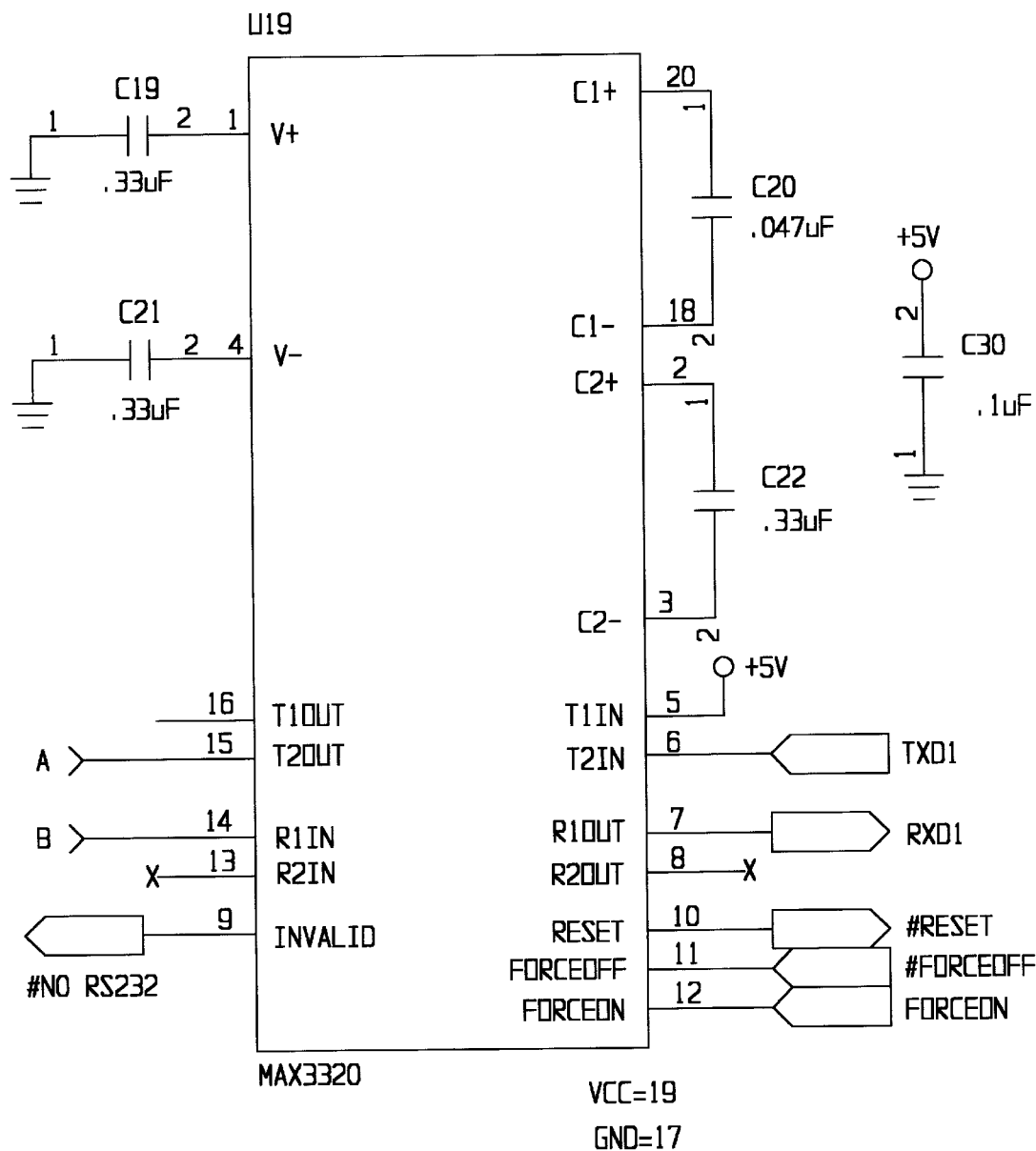
Figures 1, 6A:
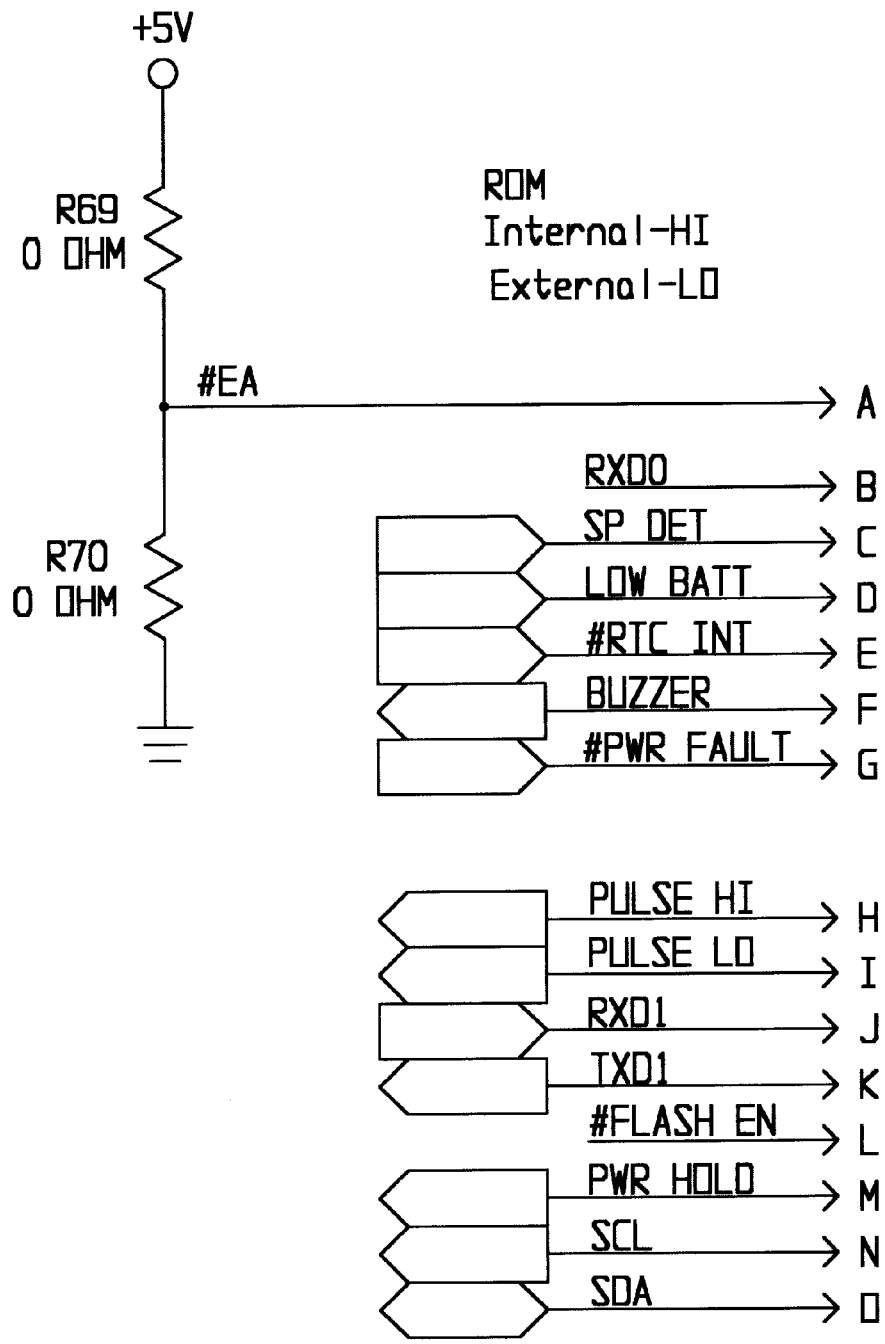
Figures 2, 6A:
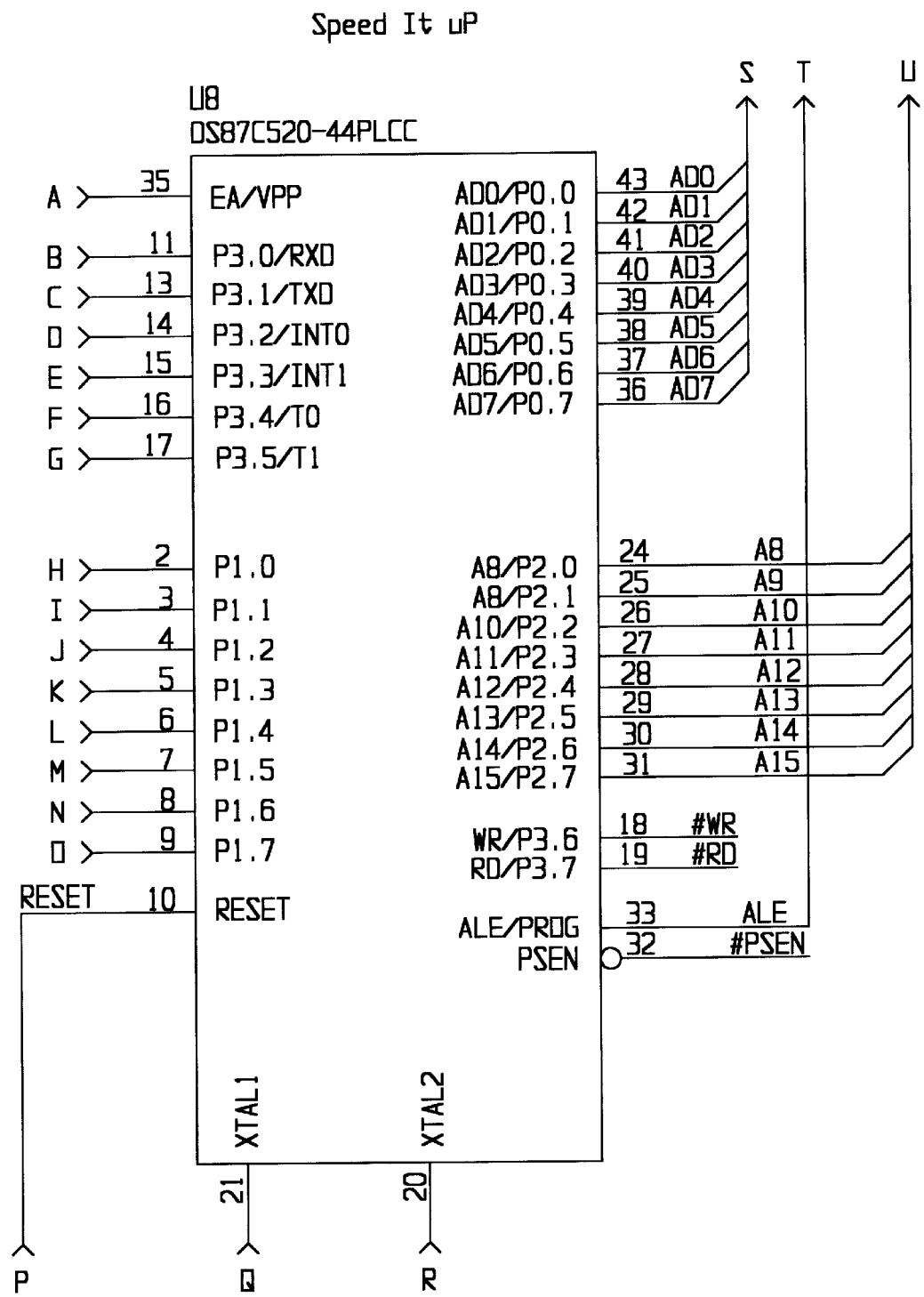
Figures 3, 6A:
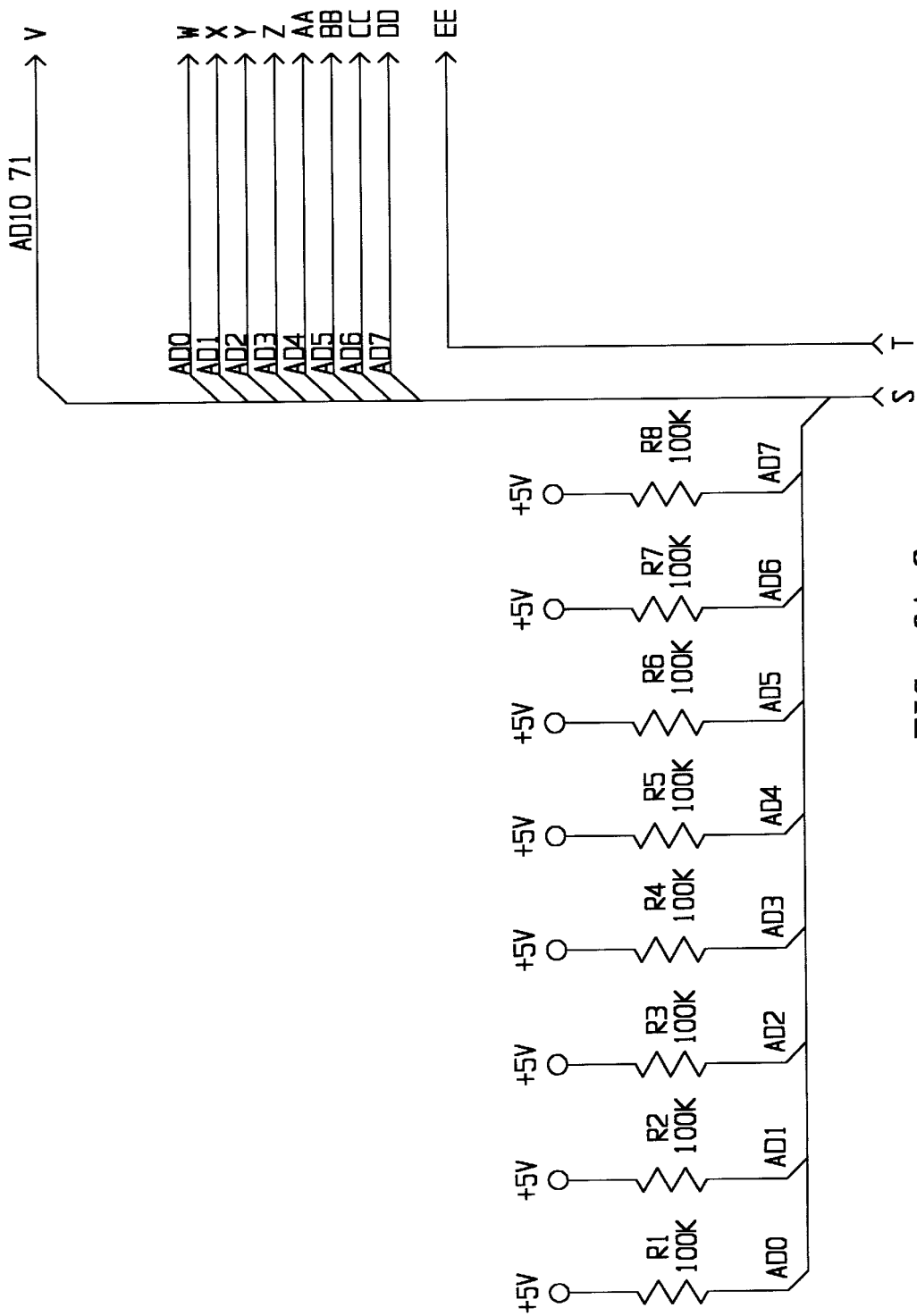
Figures 4, 6A:
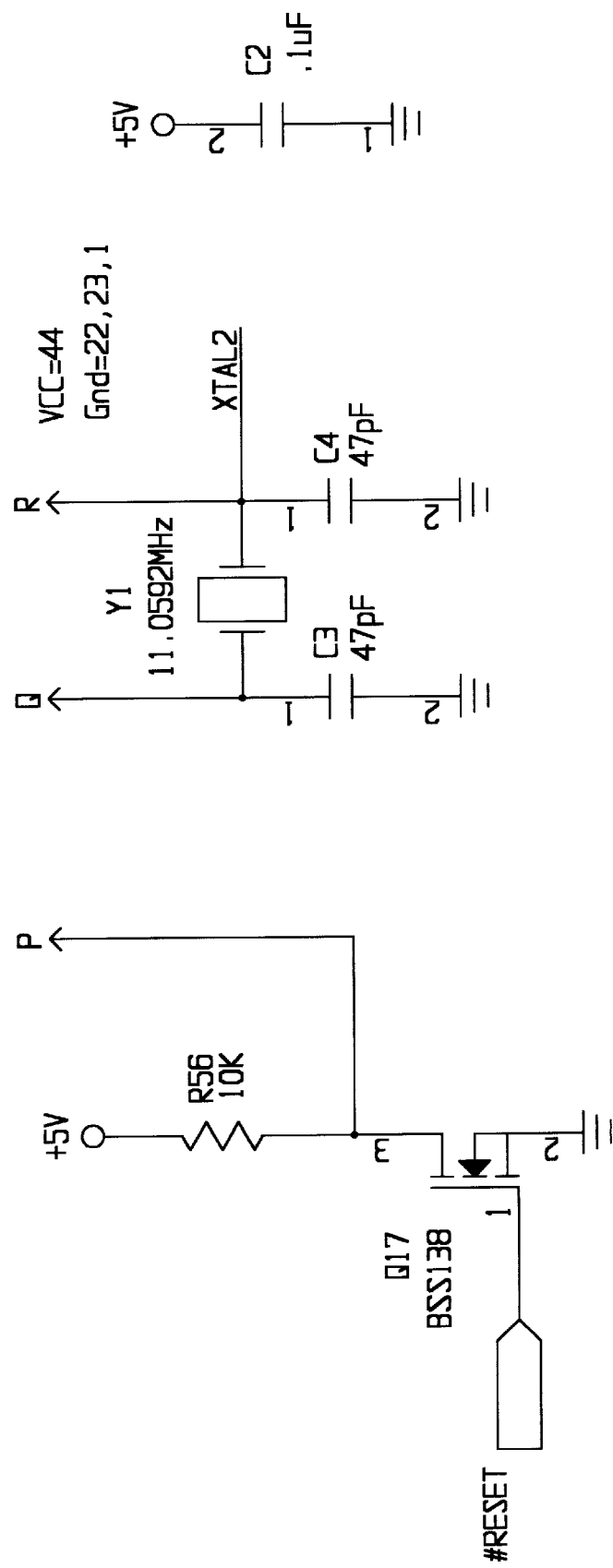
Figures 5, 6A:
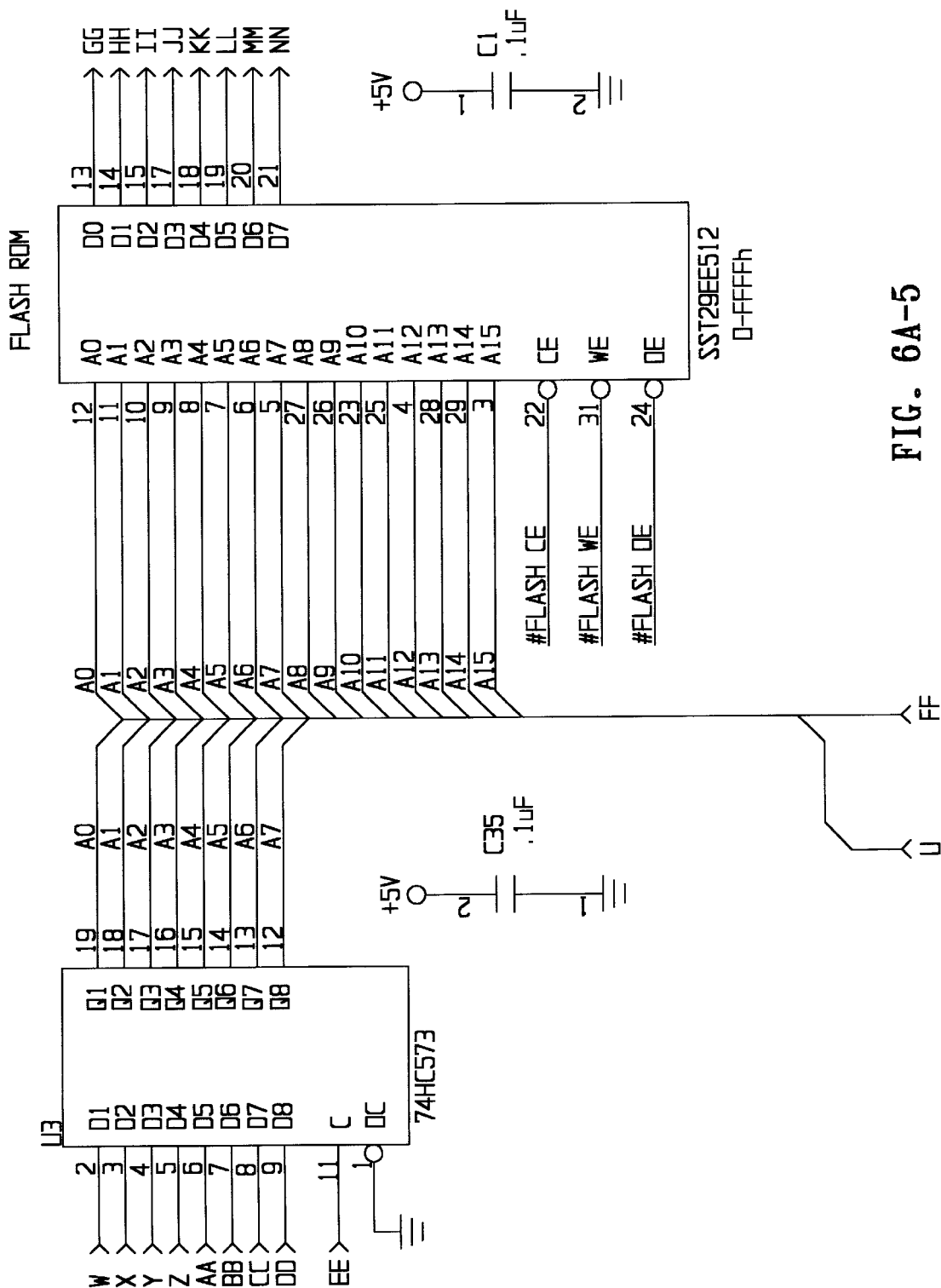
Figures 6, 6A:
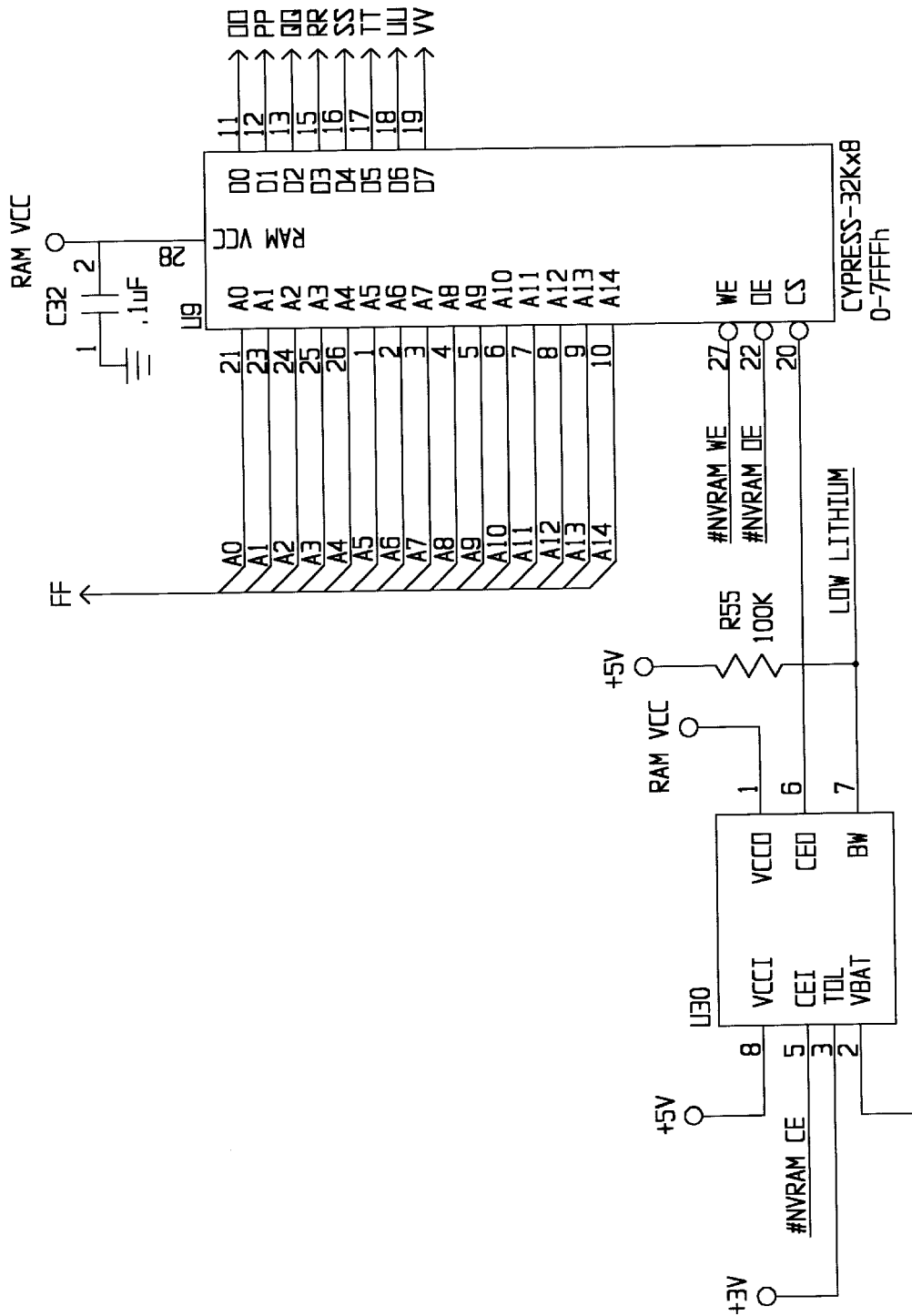
FIG. 6 is an electrical schematic of the CPU and Control (Block 3) of FIG. 4.
Figures 6, 6A, 7:
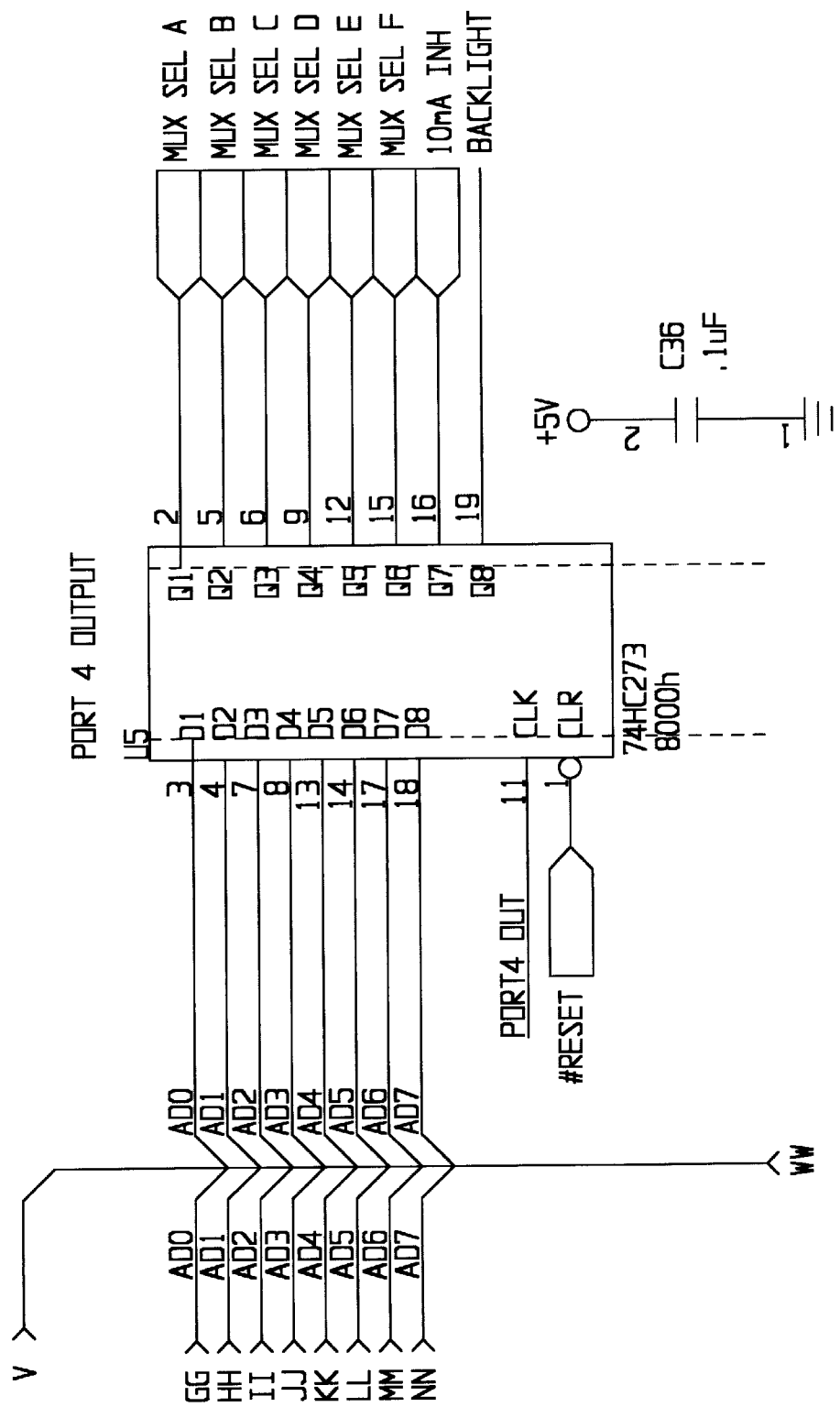
FIG. 7 is an electrical schematic of the Split Pair Detect (Block 4) of FIG. 4.
Figures 6, 6A, 7, 8:
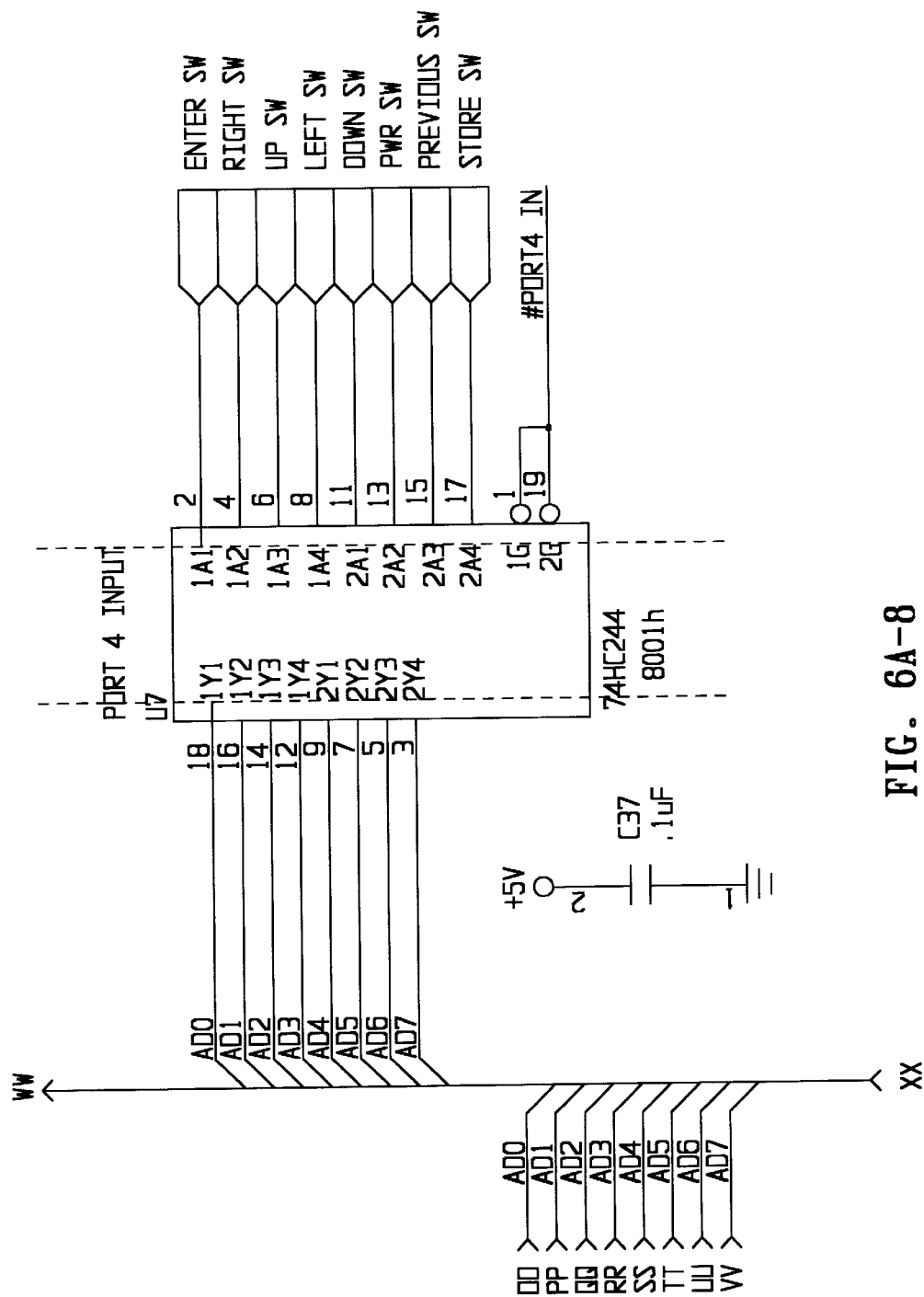
FIG. 8 is an electrical schematic of the Analog Interface (Block 5) of FIG. 4.
Figures 6, 6A, 7, 8, 9:
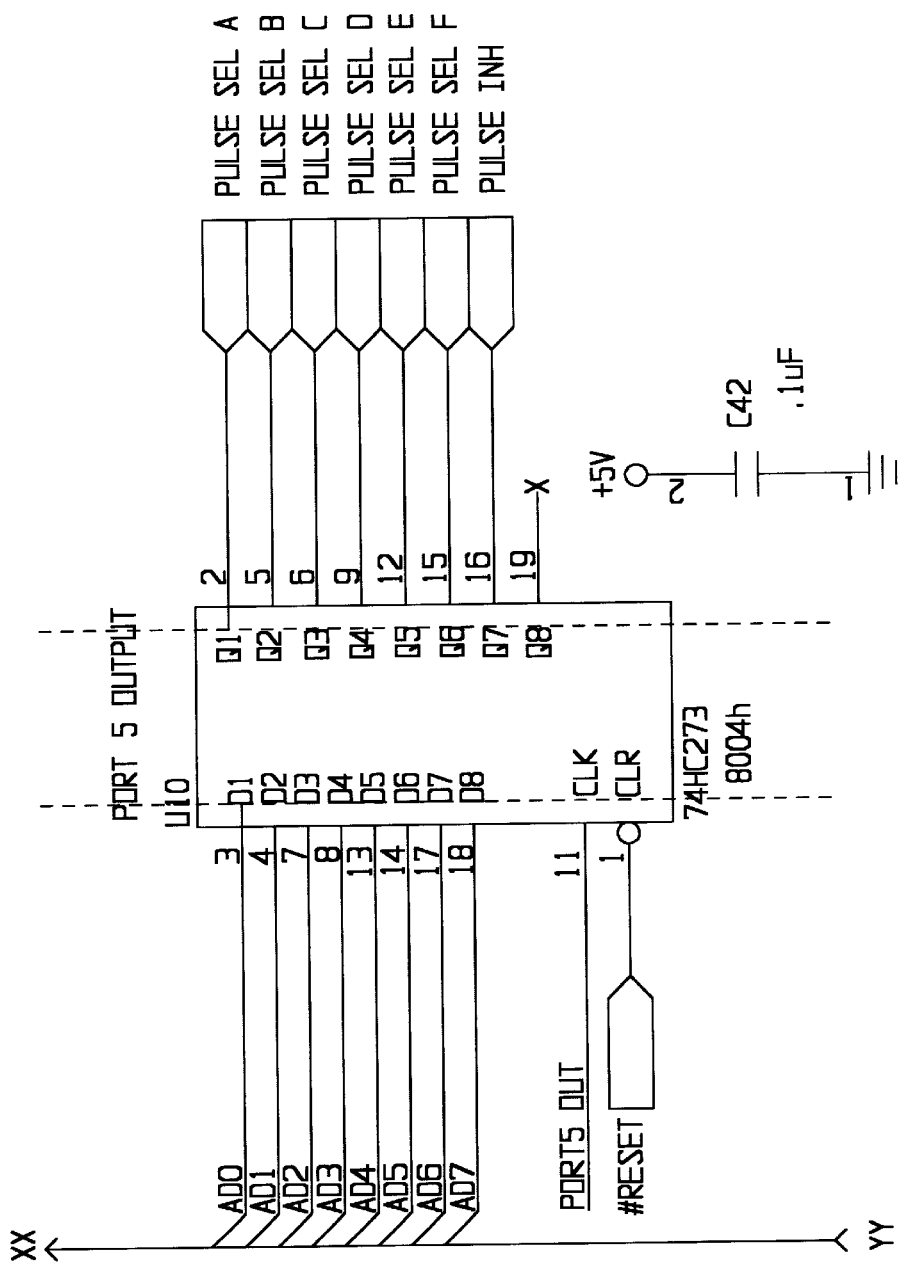
FIG. 9 is an electrical schematic of the Peripheral Controls (Block 6) of FIG. 4.
Figures 6, 6A, 7, 8, 9, 10:
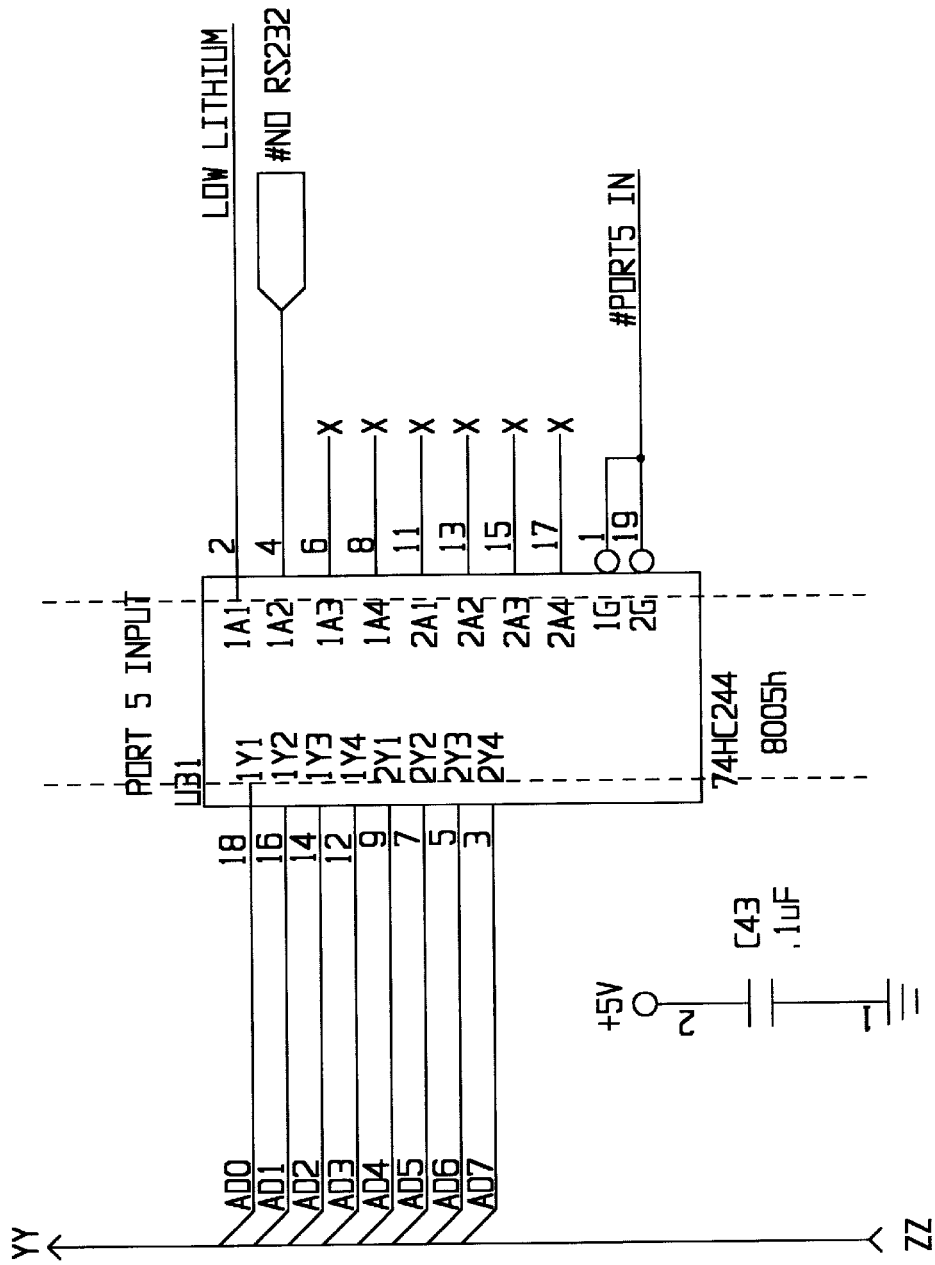
FIG. 10 is an electrical schematic of the LCD display of the test set unit.
Figures 6, 6A, 7, 8, 9, 10, 11:
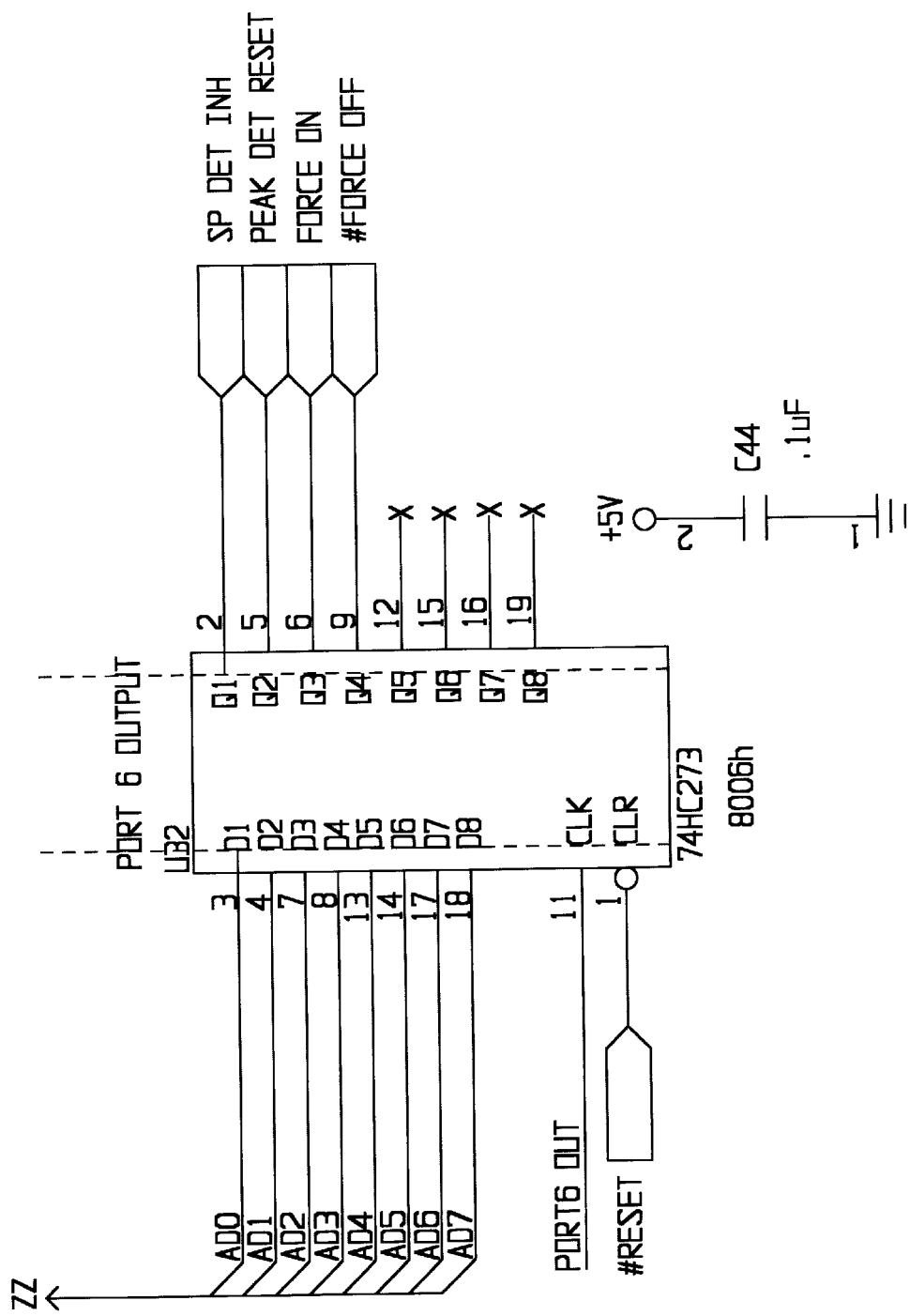
FIG. 11 is an electrical schematic of the programmable terminator unit.
Figures 1, 6B:
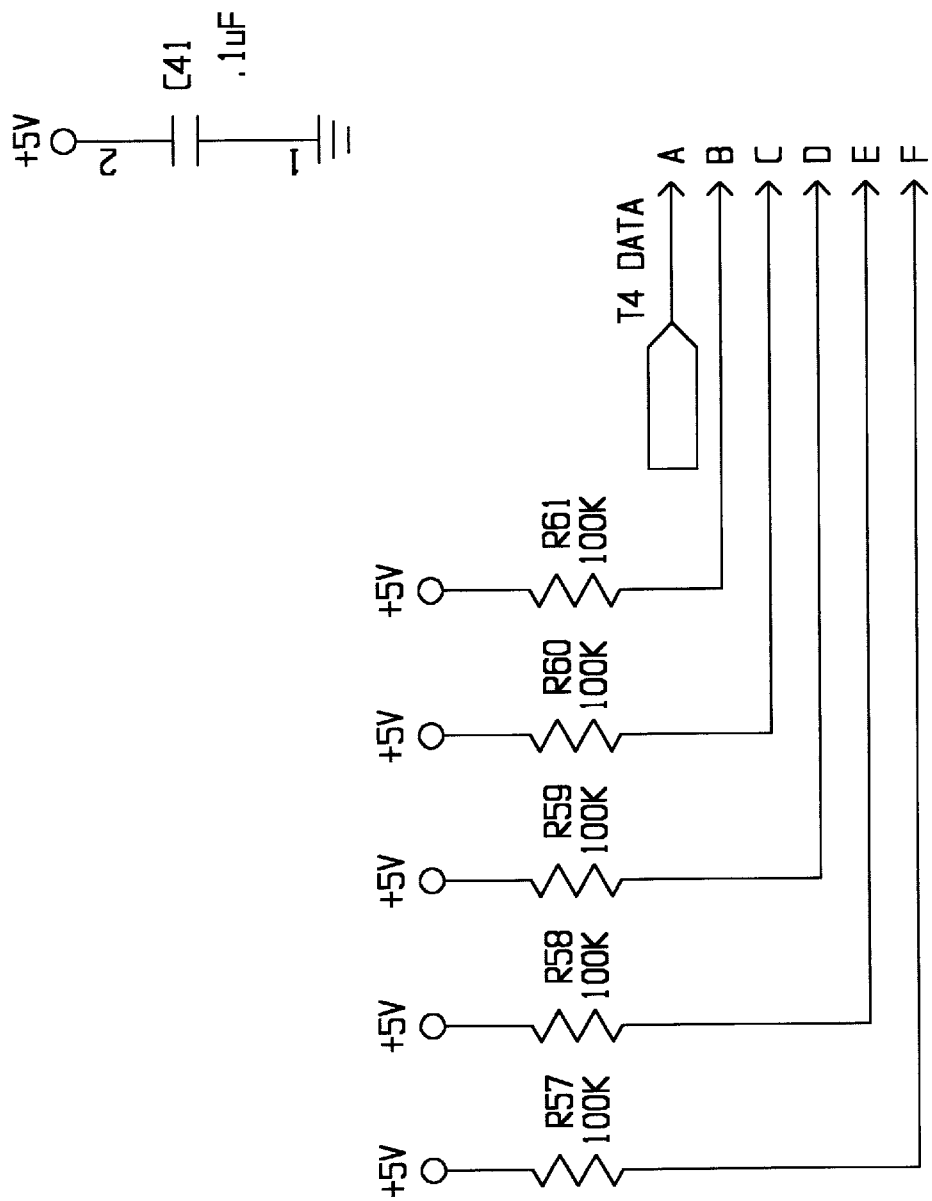
Figures 2, 6B:
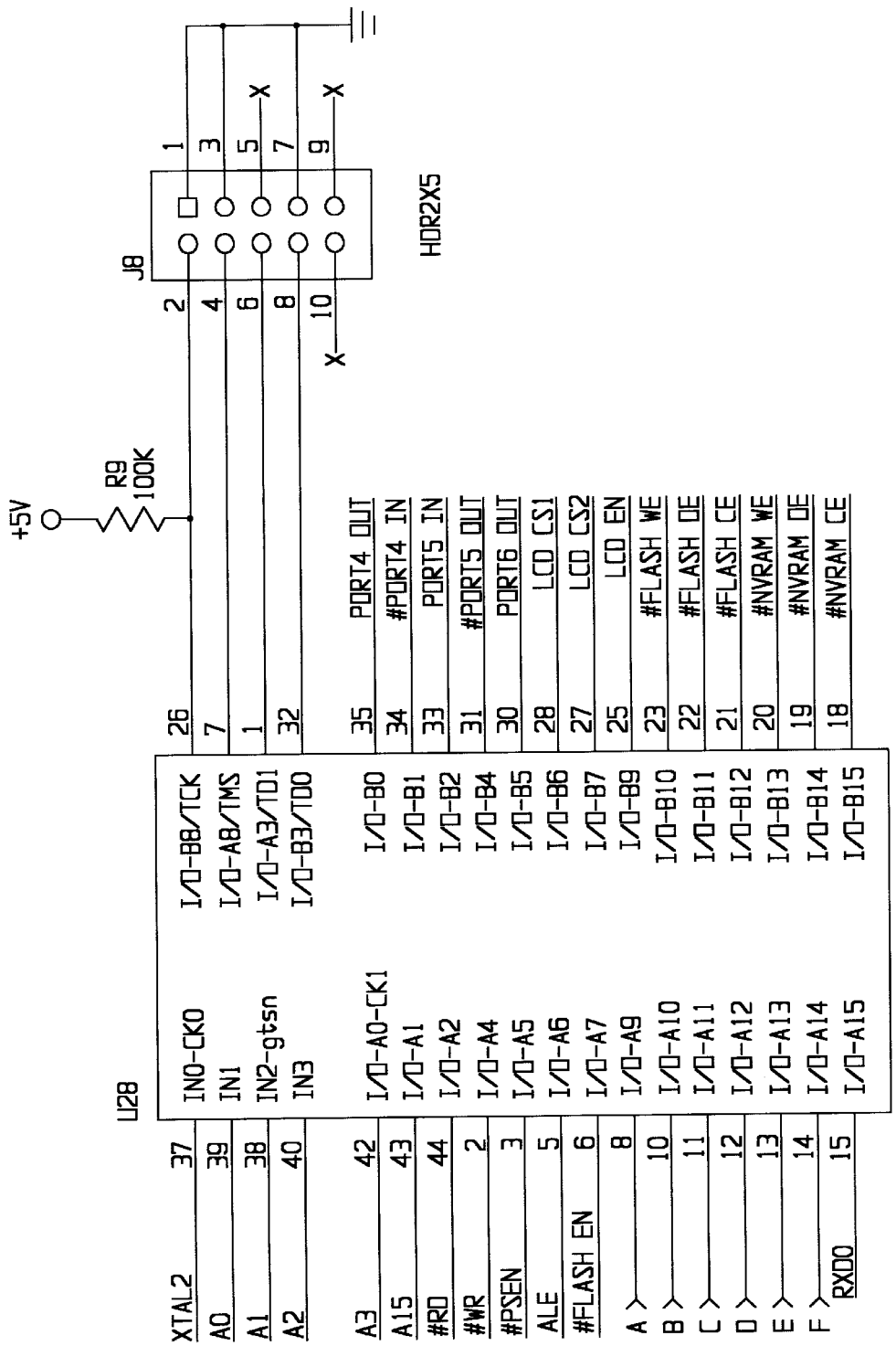
Figure 6C:
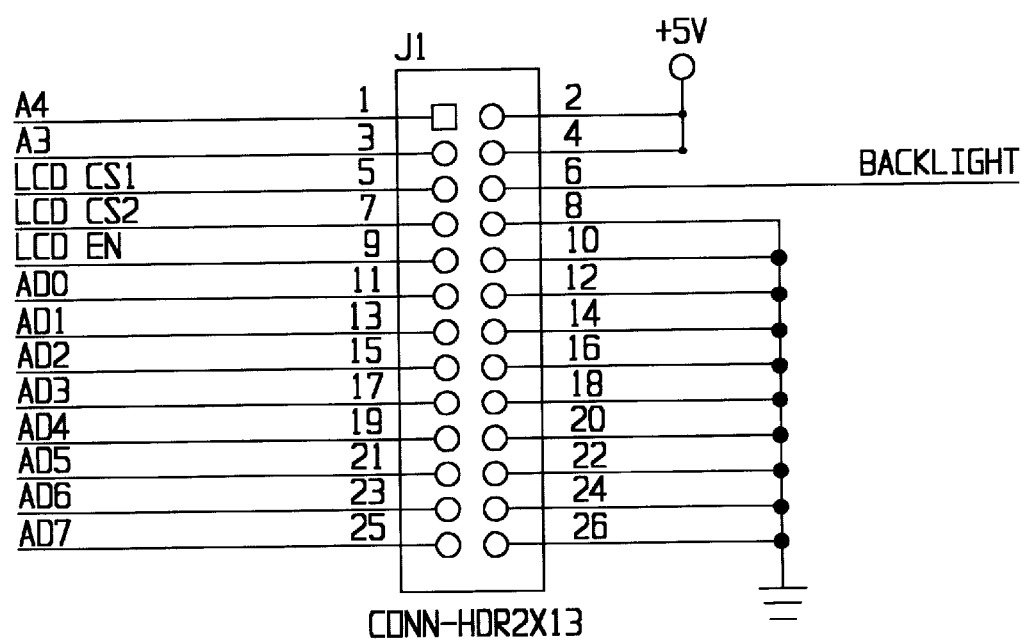
Figure 7A:
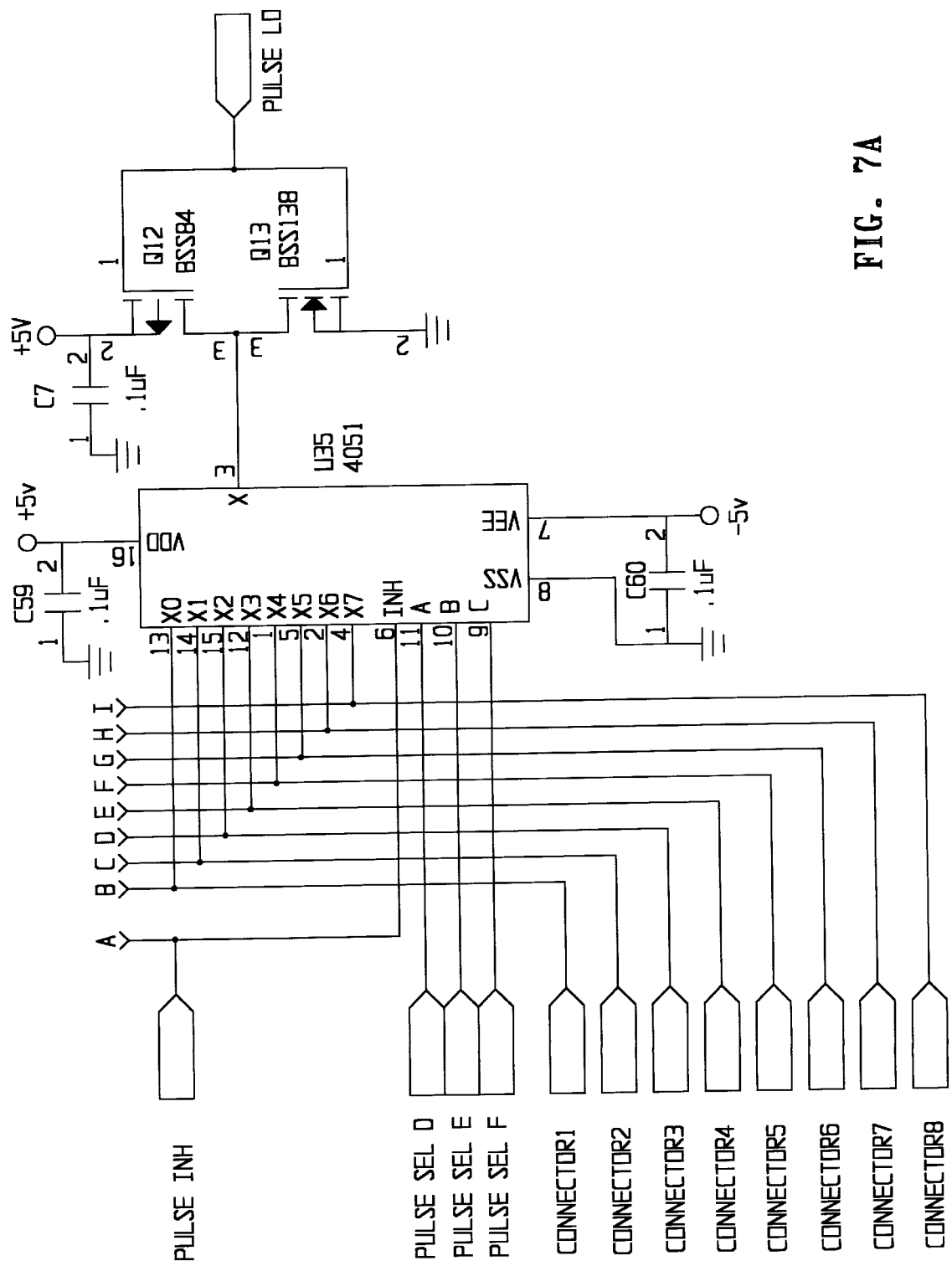
Figure 7B:
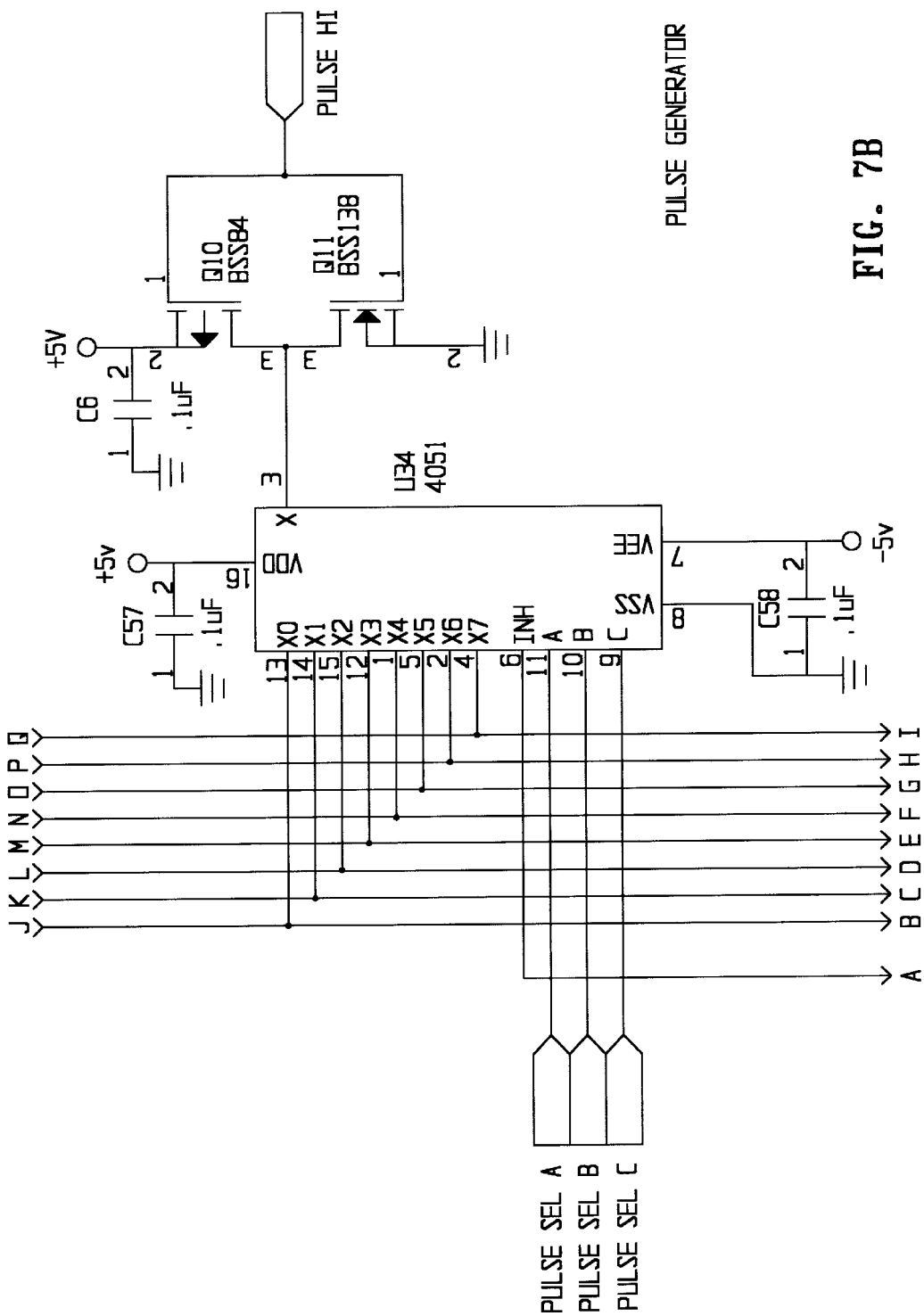
Figure 7C:
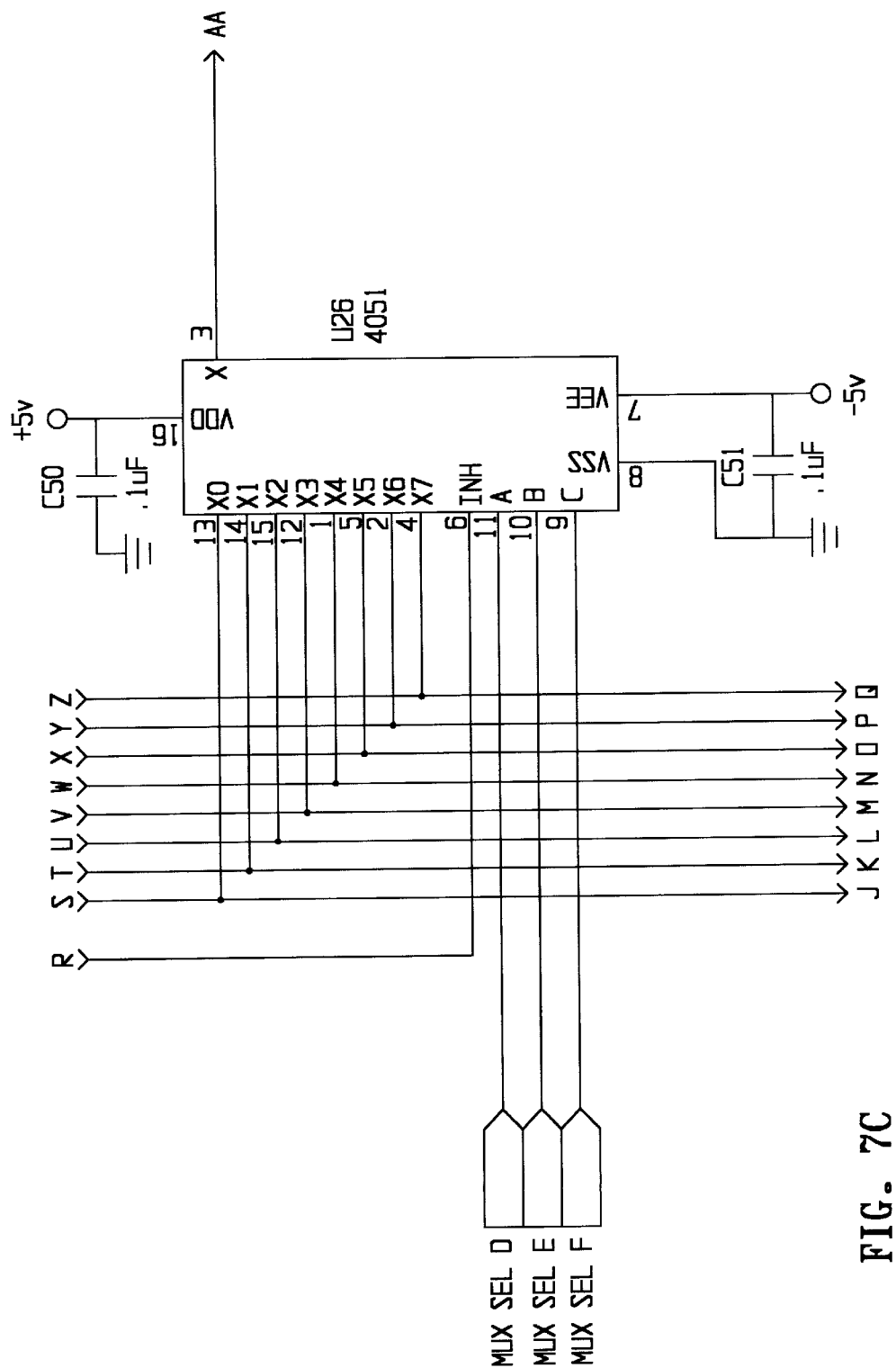
Figure 7D:
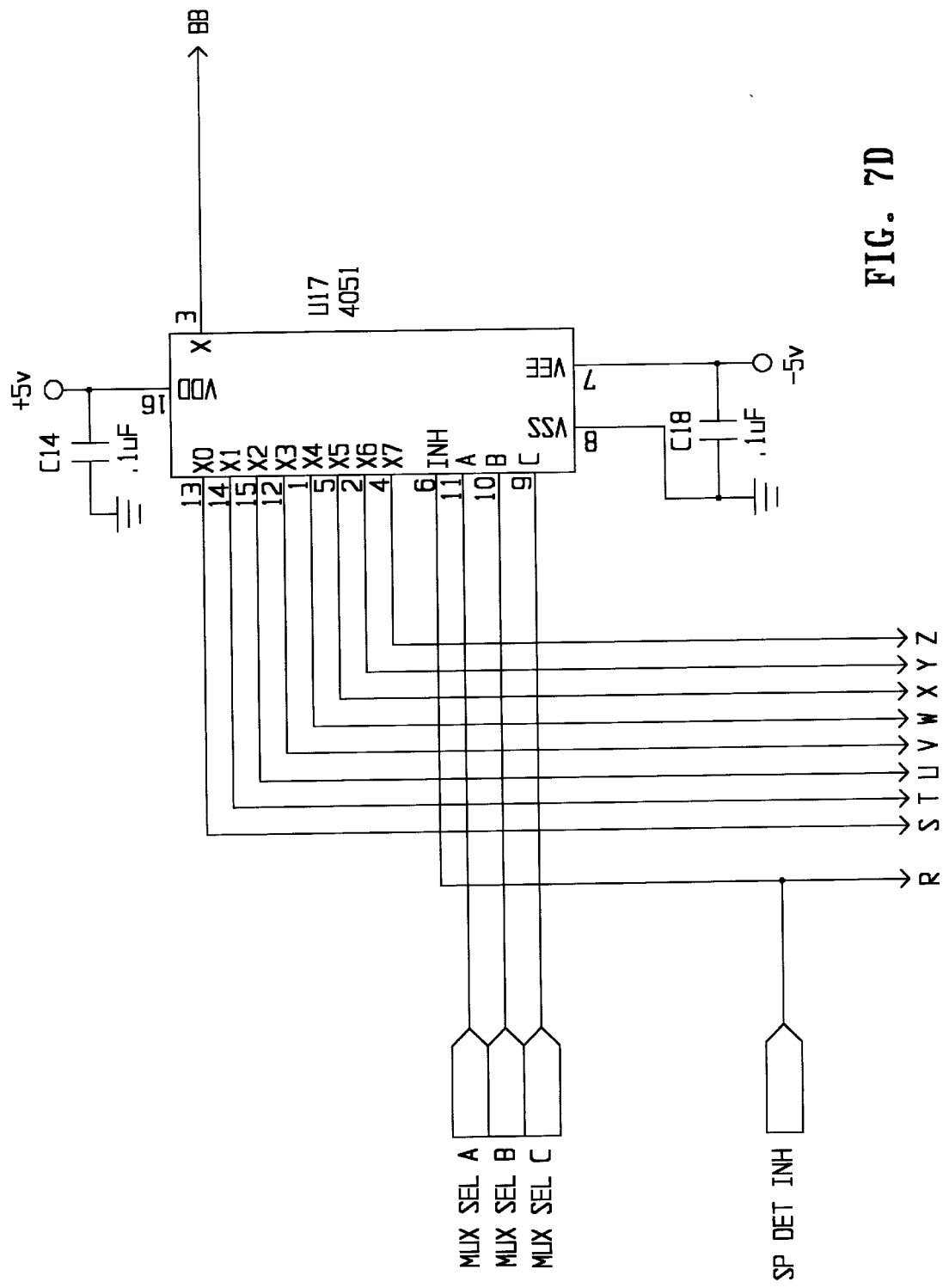
Figure 7E:
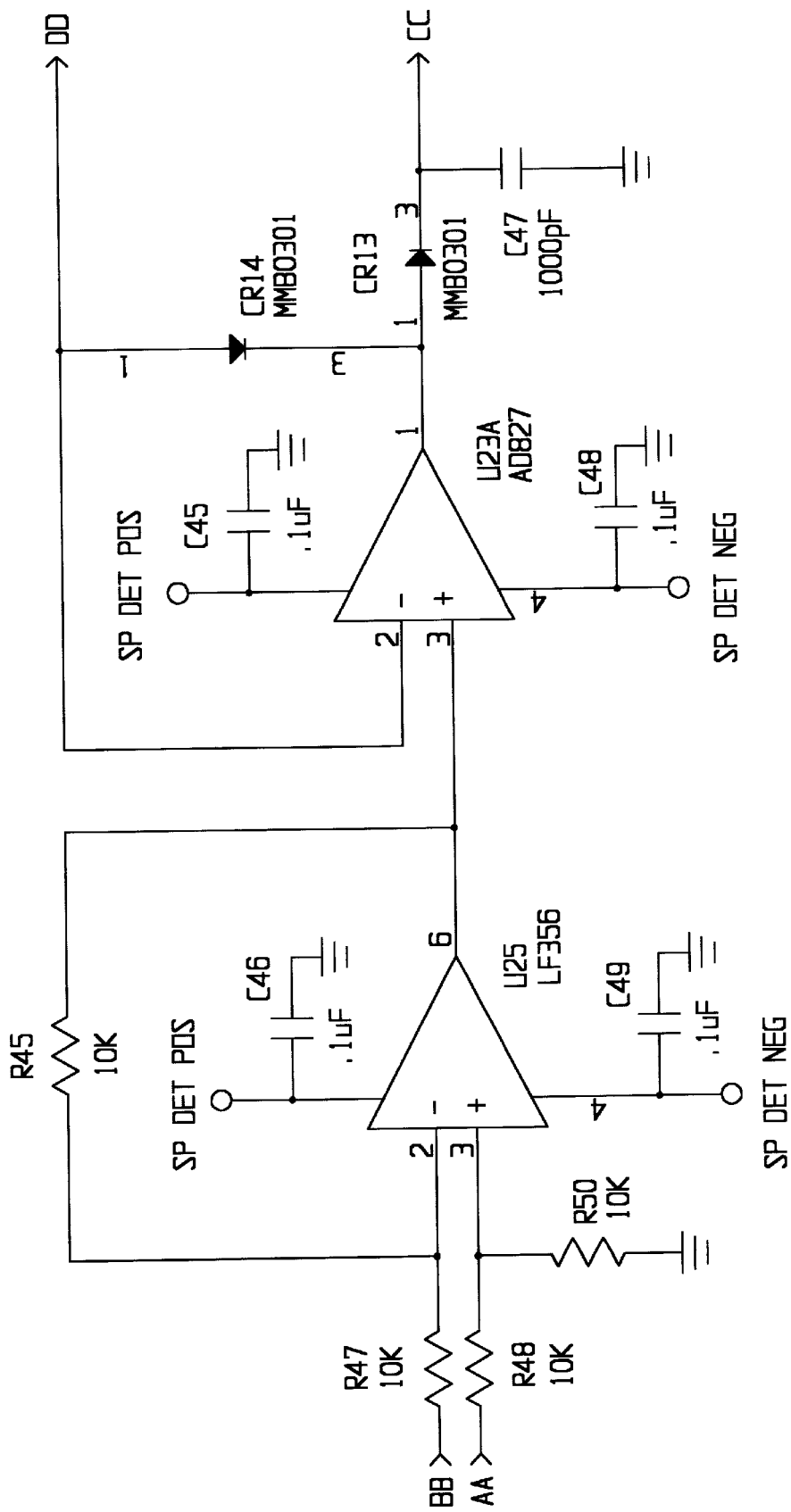
Figure 7F:
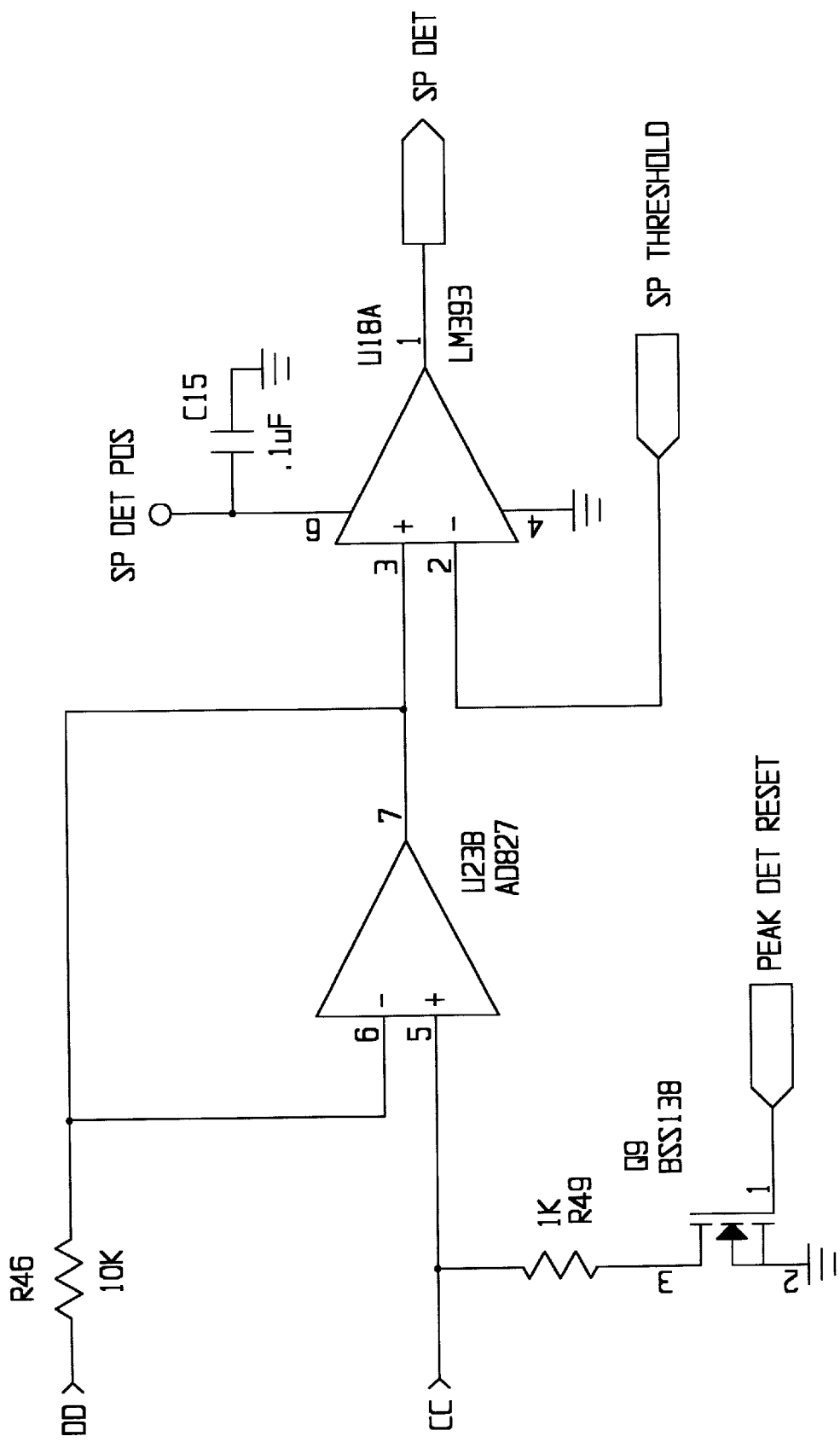
Figure 8A:
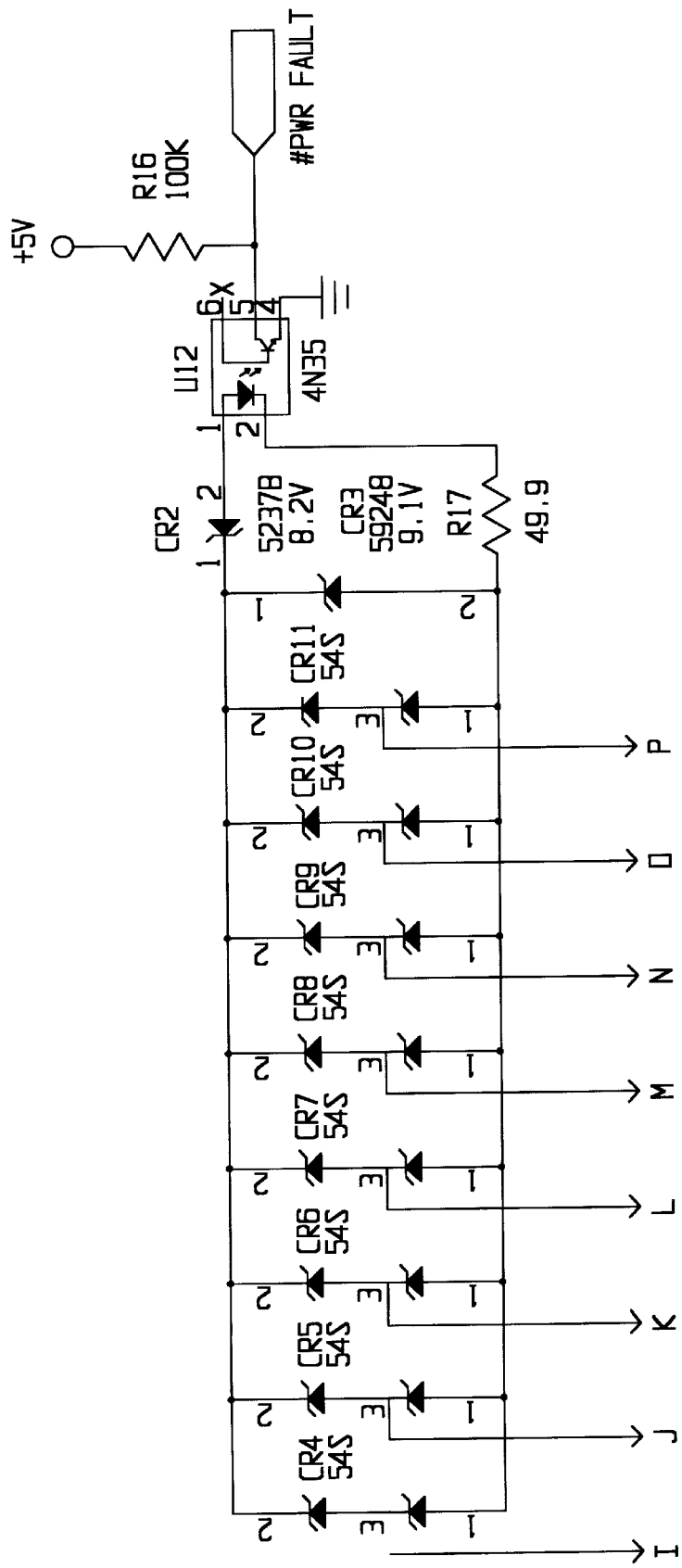
Figure 8B:
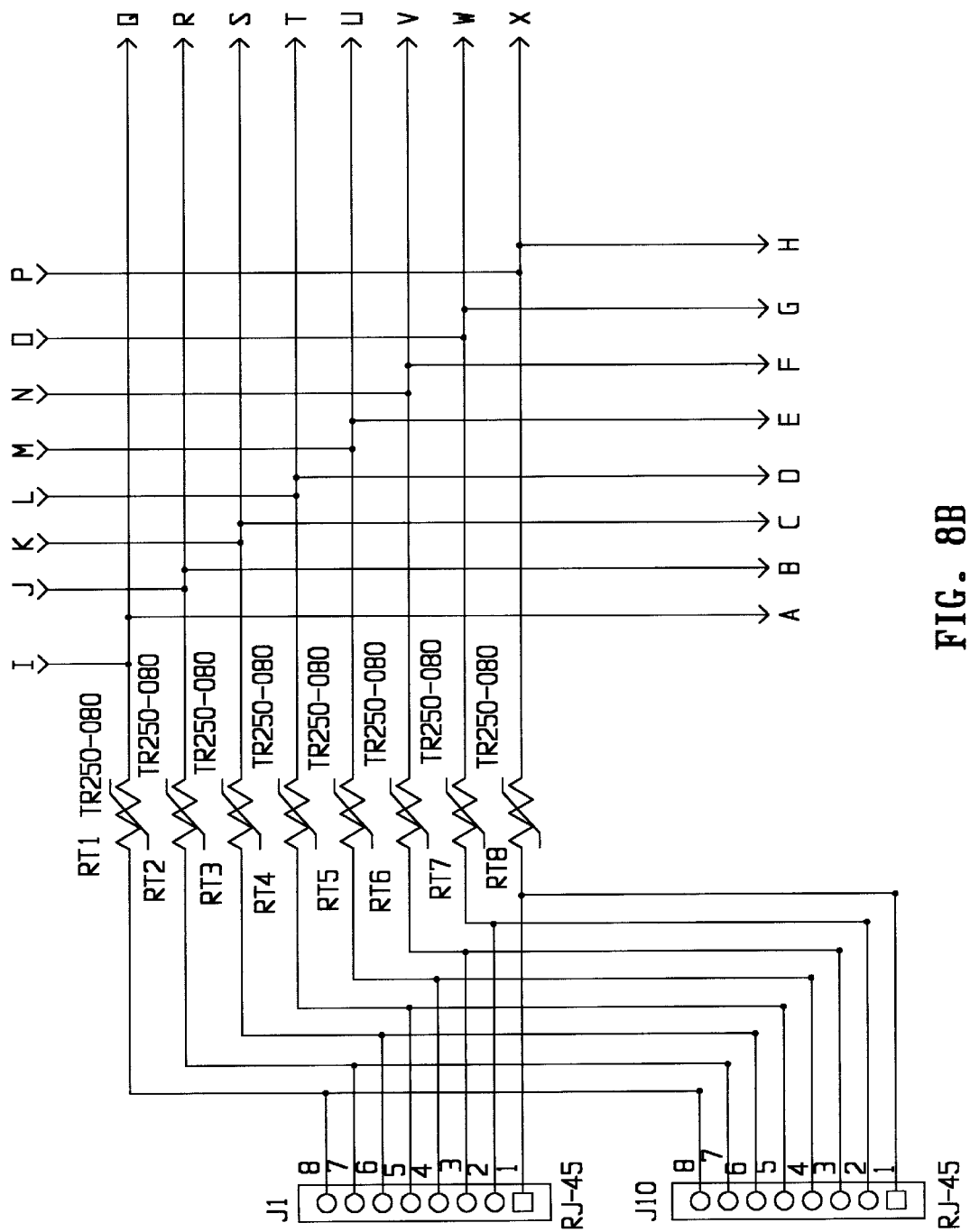
Figure 8C:
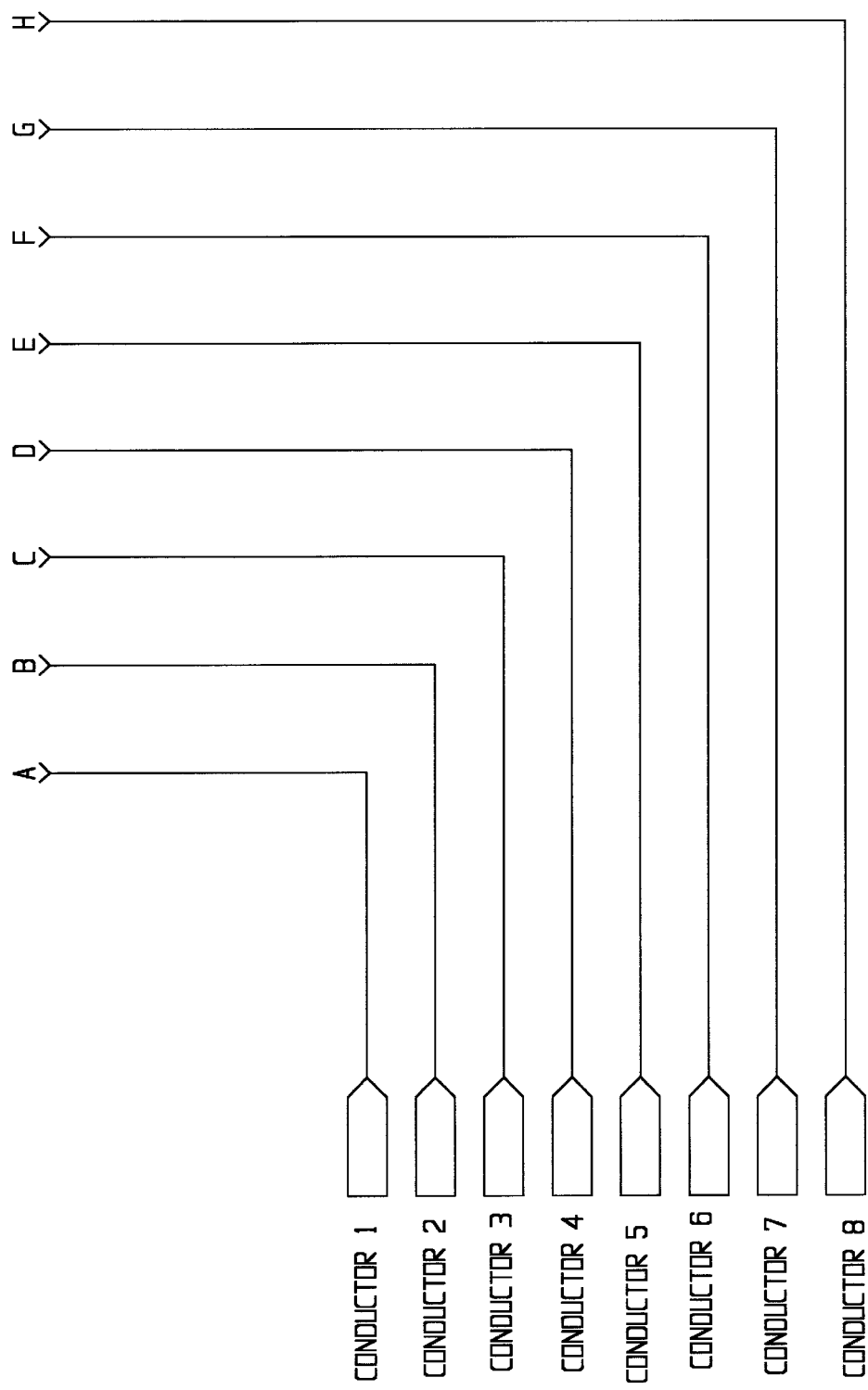
Figure 8D:
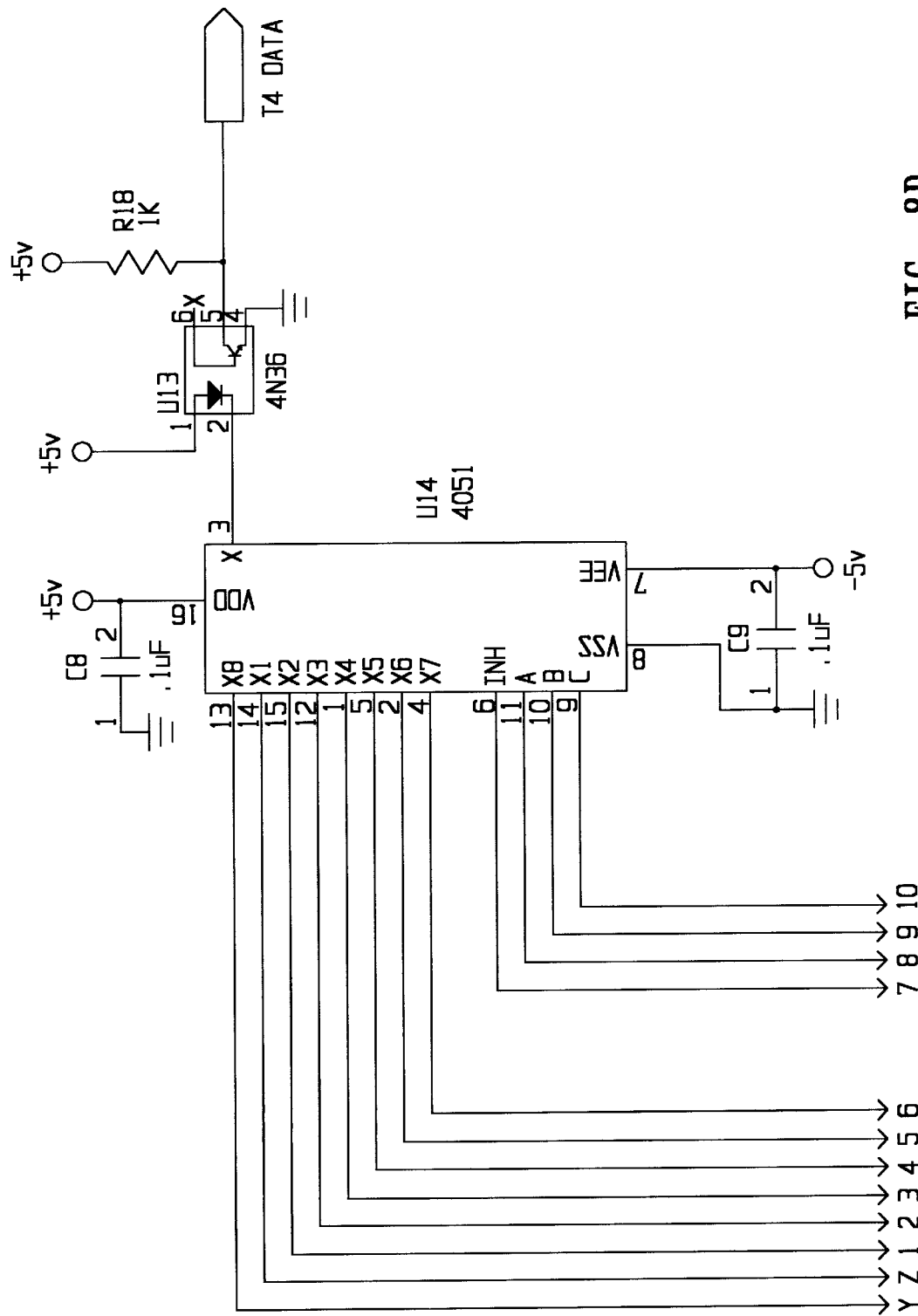
Figure 8E:
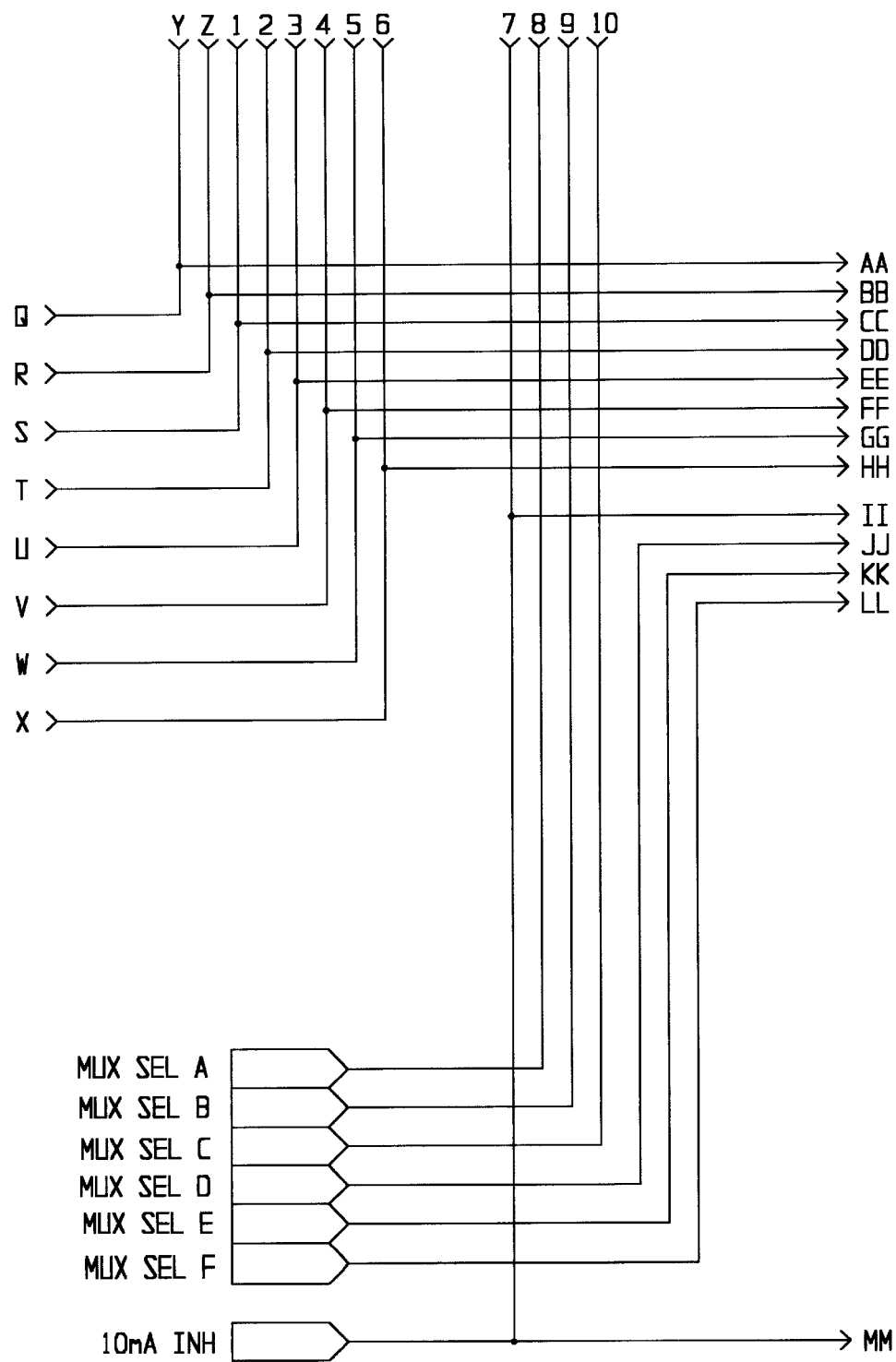
Figure 8F:
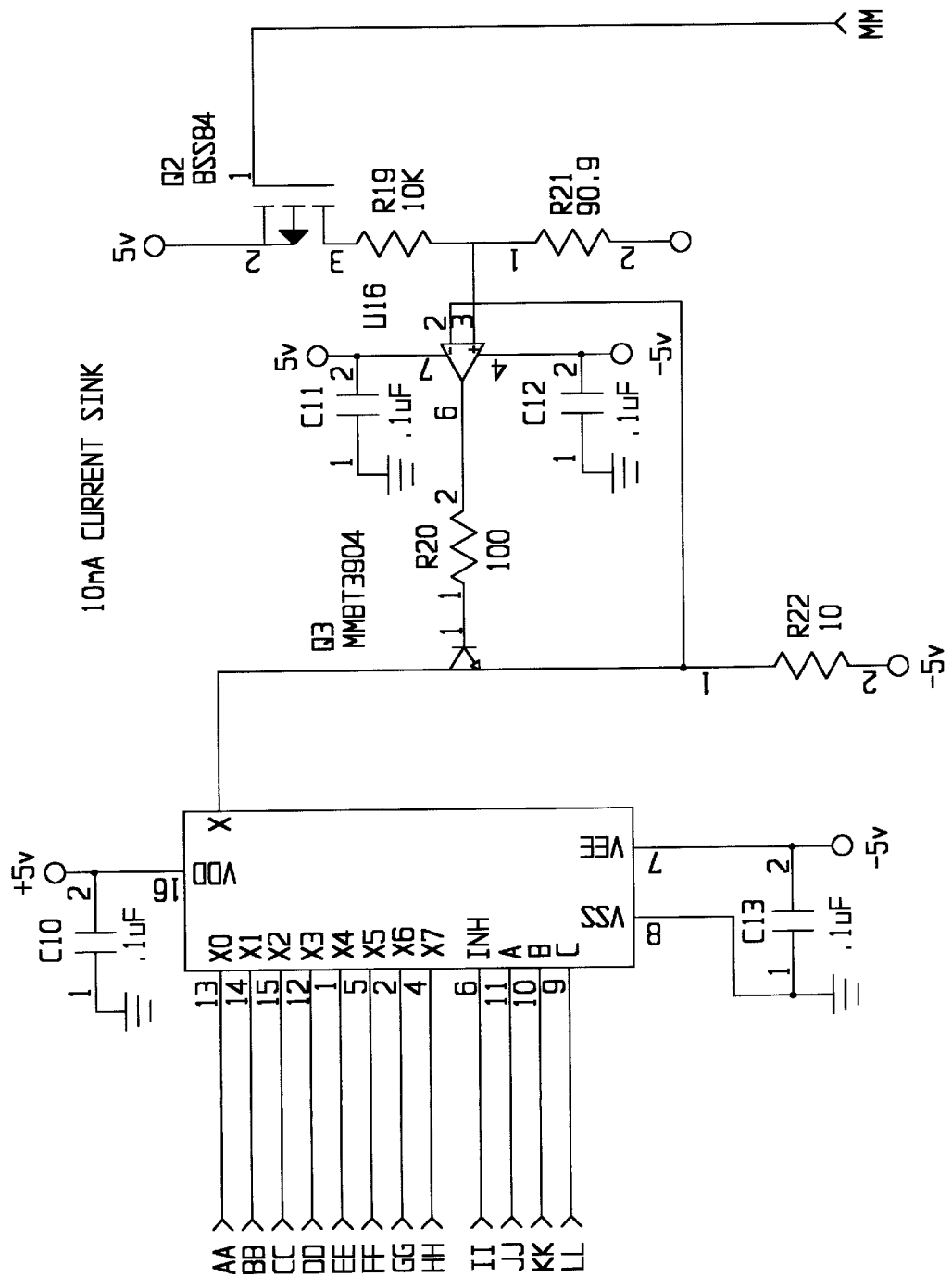
Figure 9A:
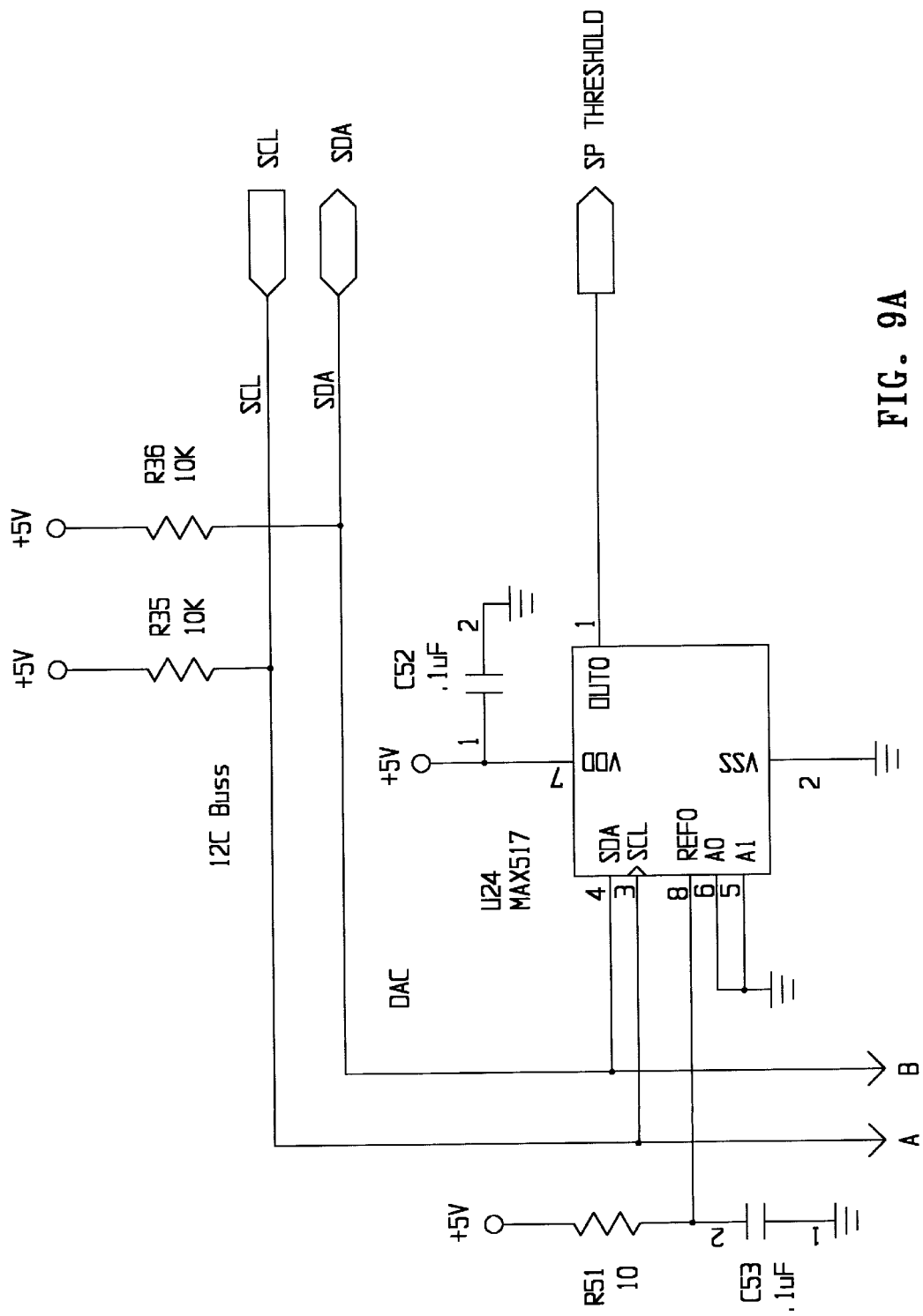
Figure 9B:
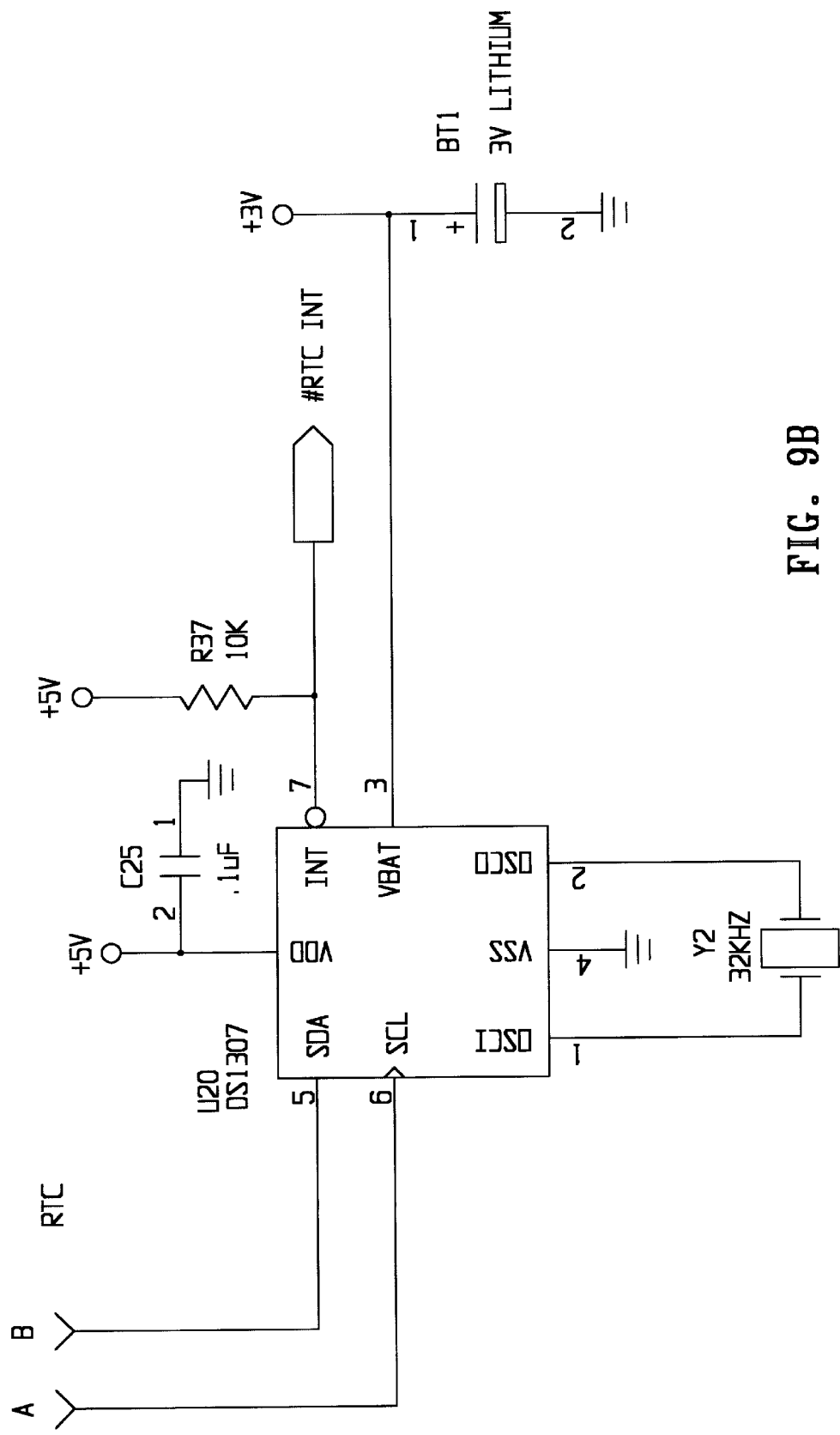
Figure 10A:
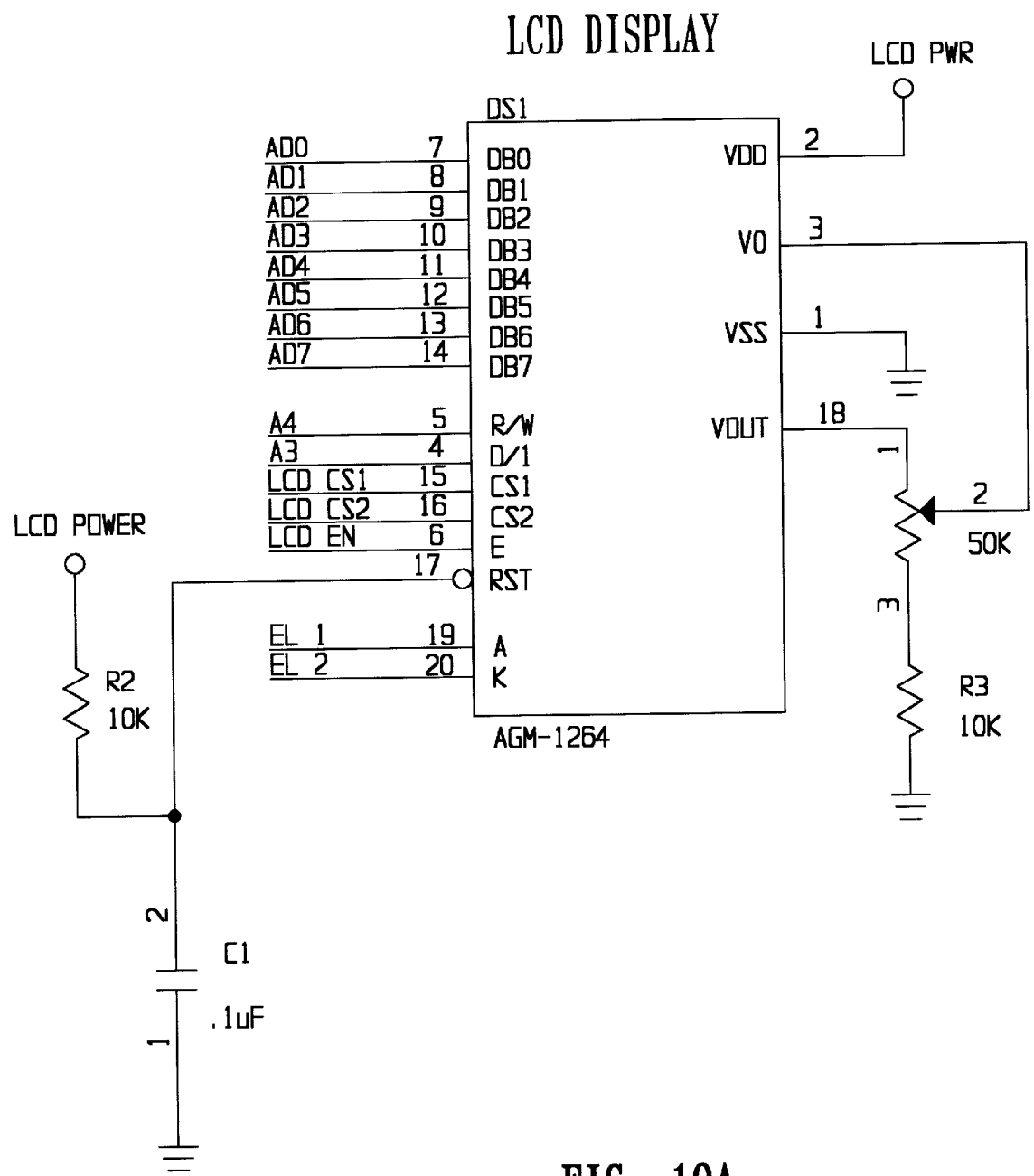
Figure 10B:
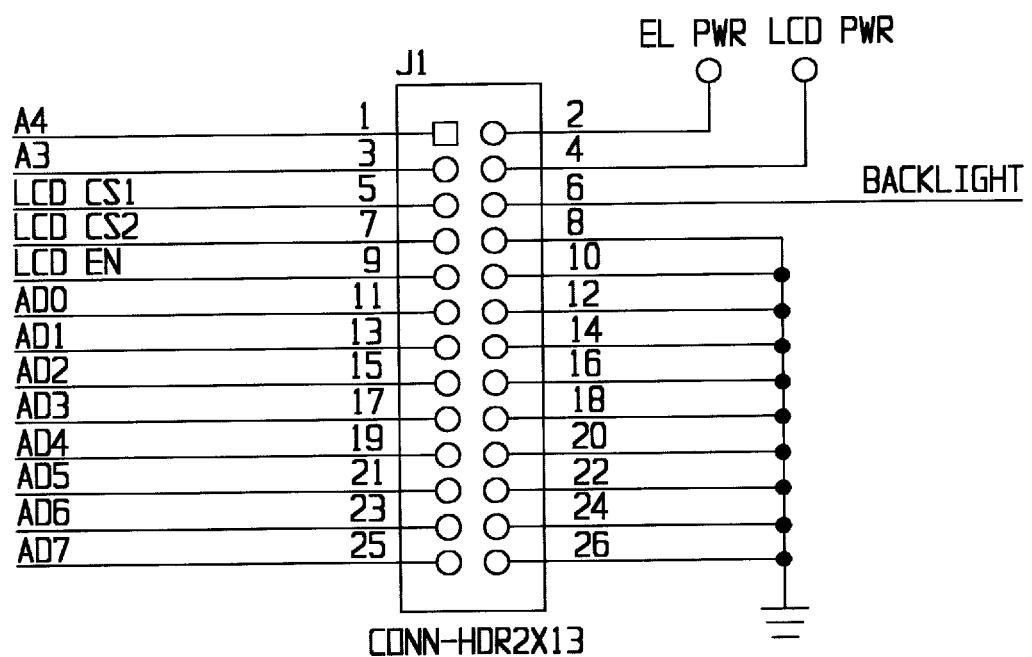
Figure 10C:
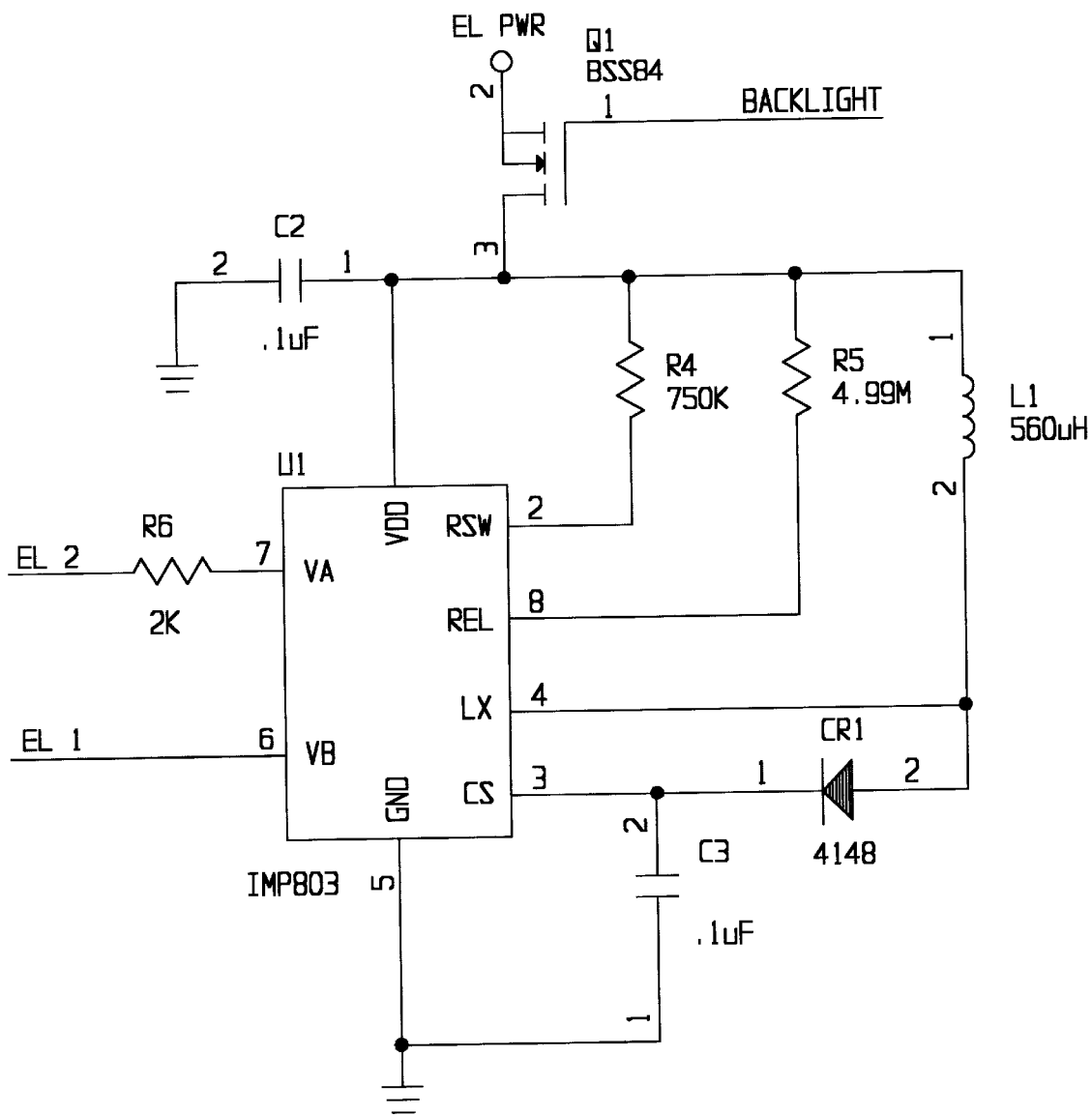
Figures 1, 11A:
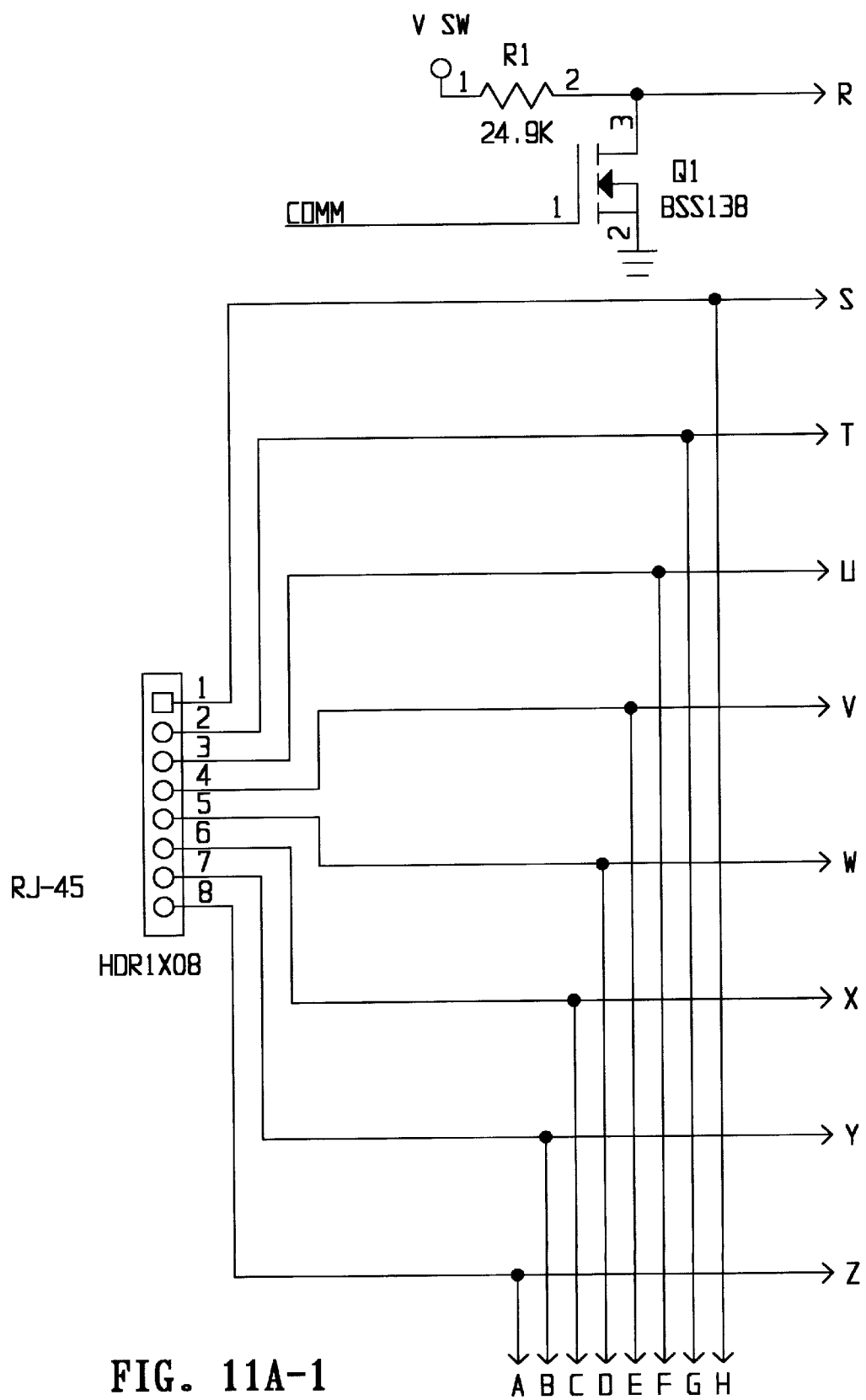
Figures 2, 11A:
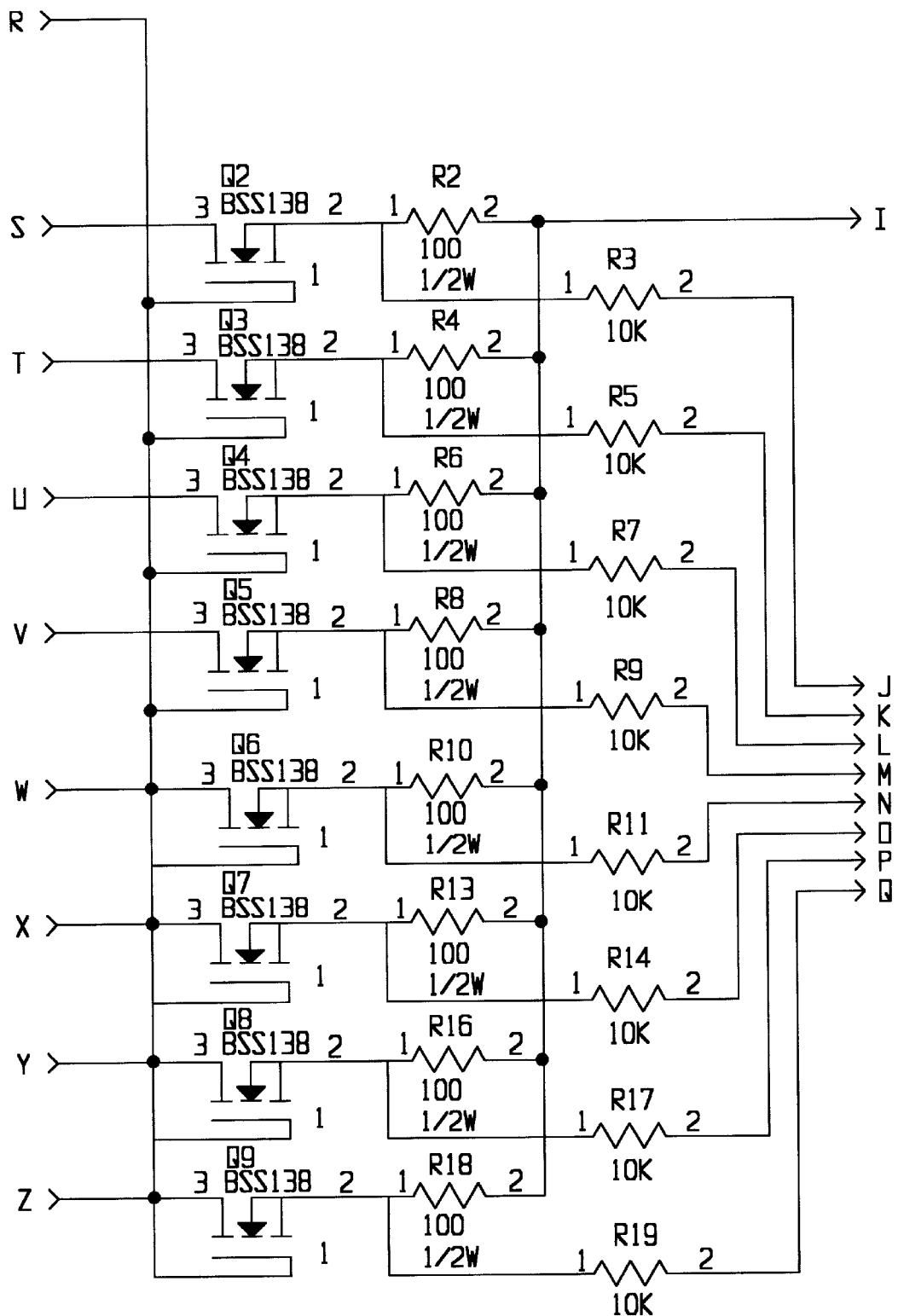
Figures 3, 11A:
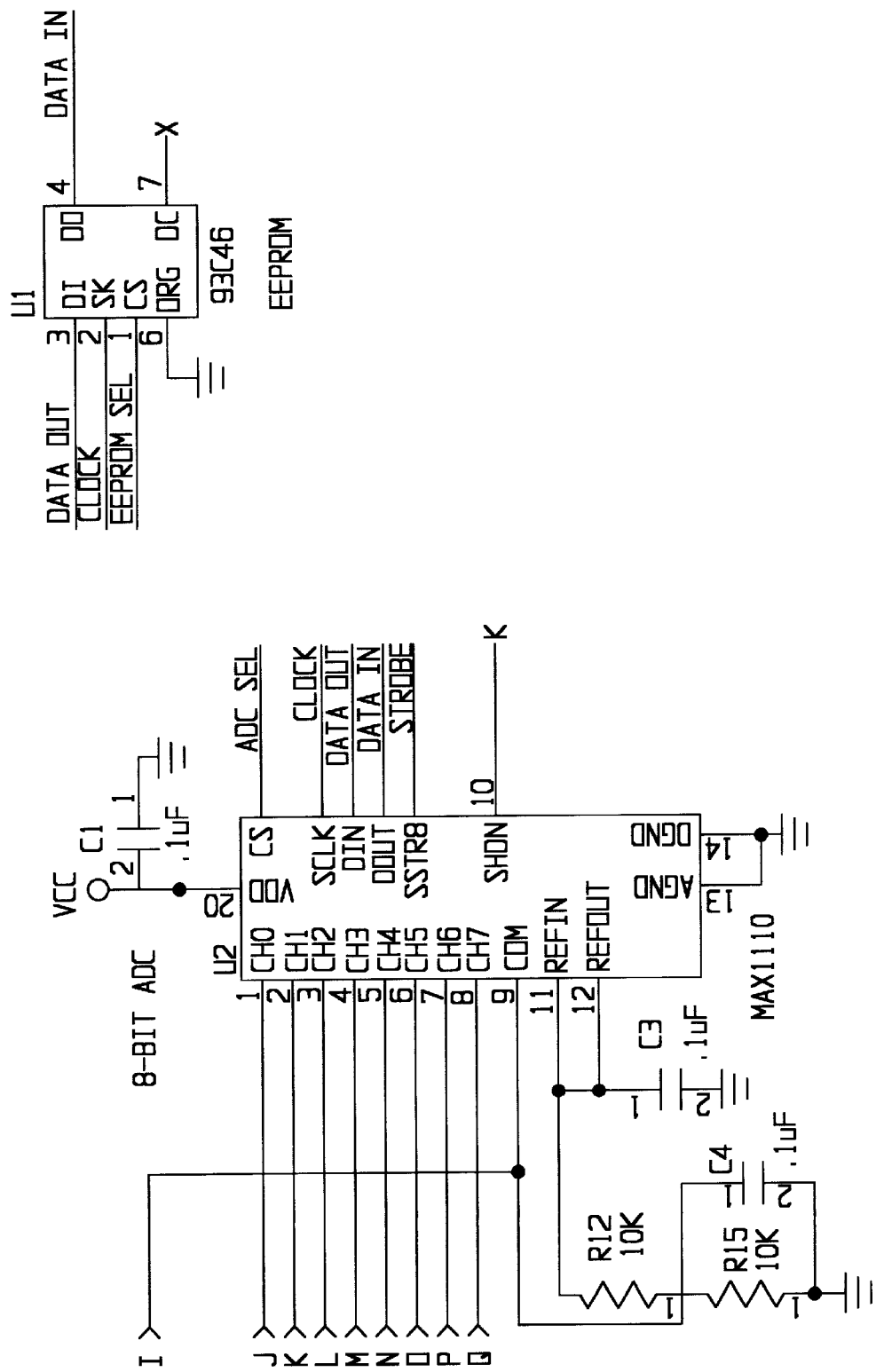
Figures 4, 11A:
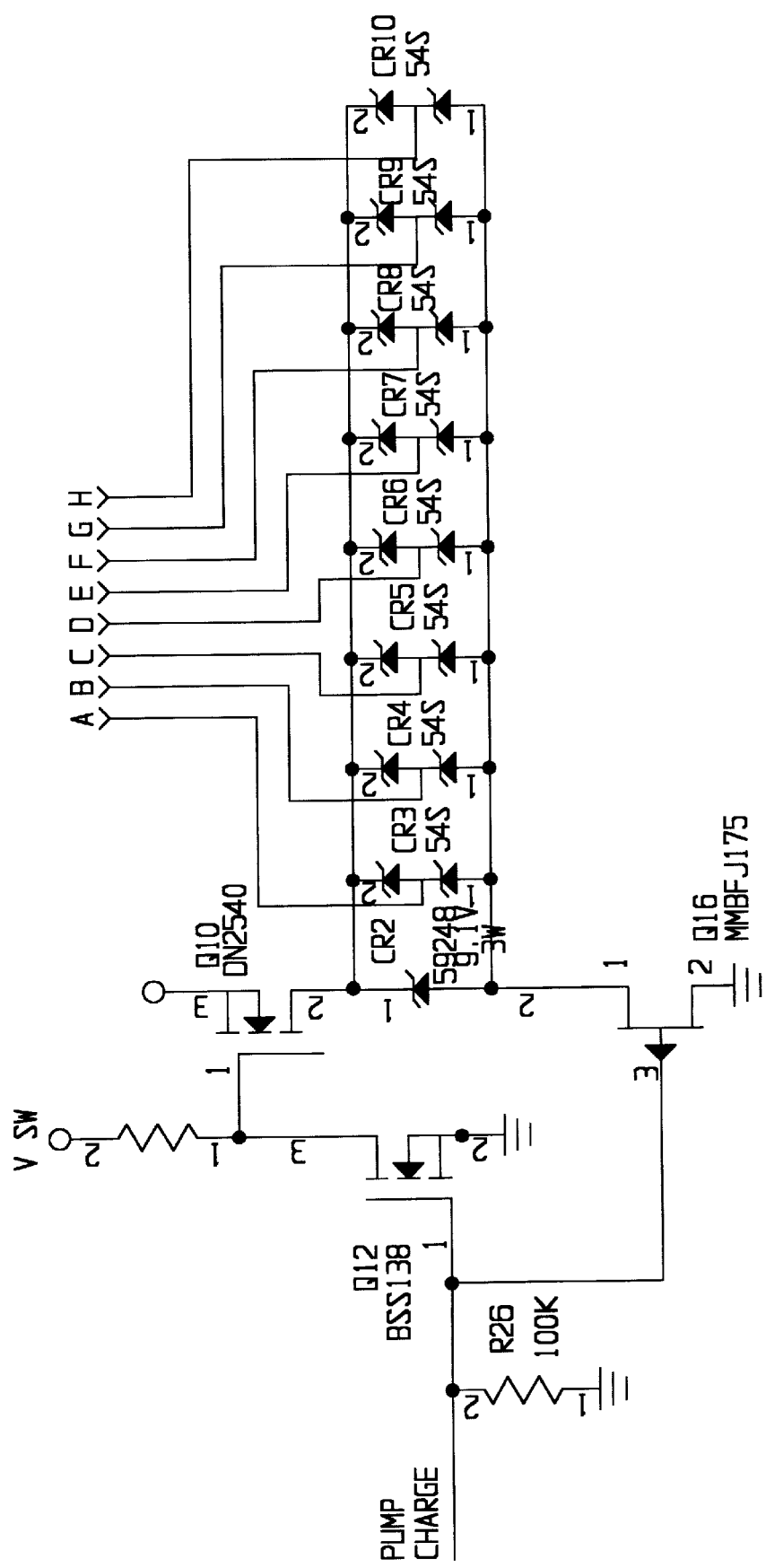
Figures 1, 11B:
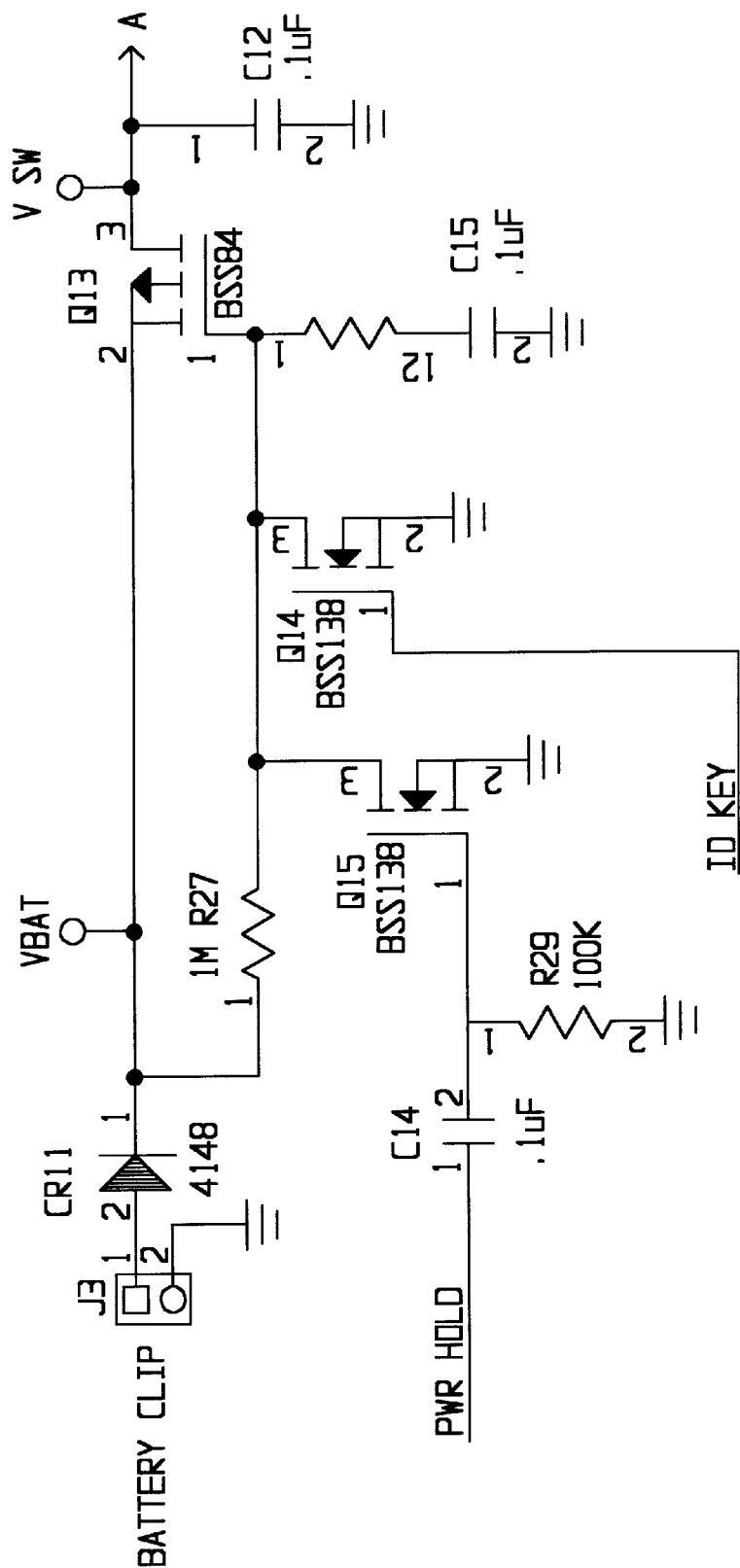
Figures 2, 11B:
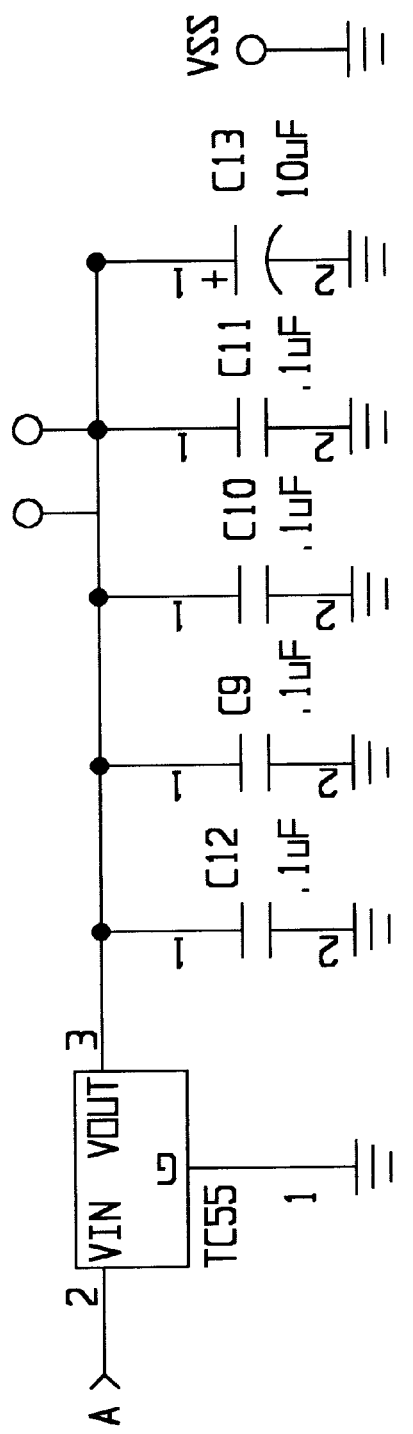
Figures 1, 11C:
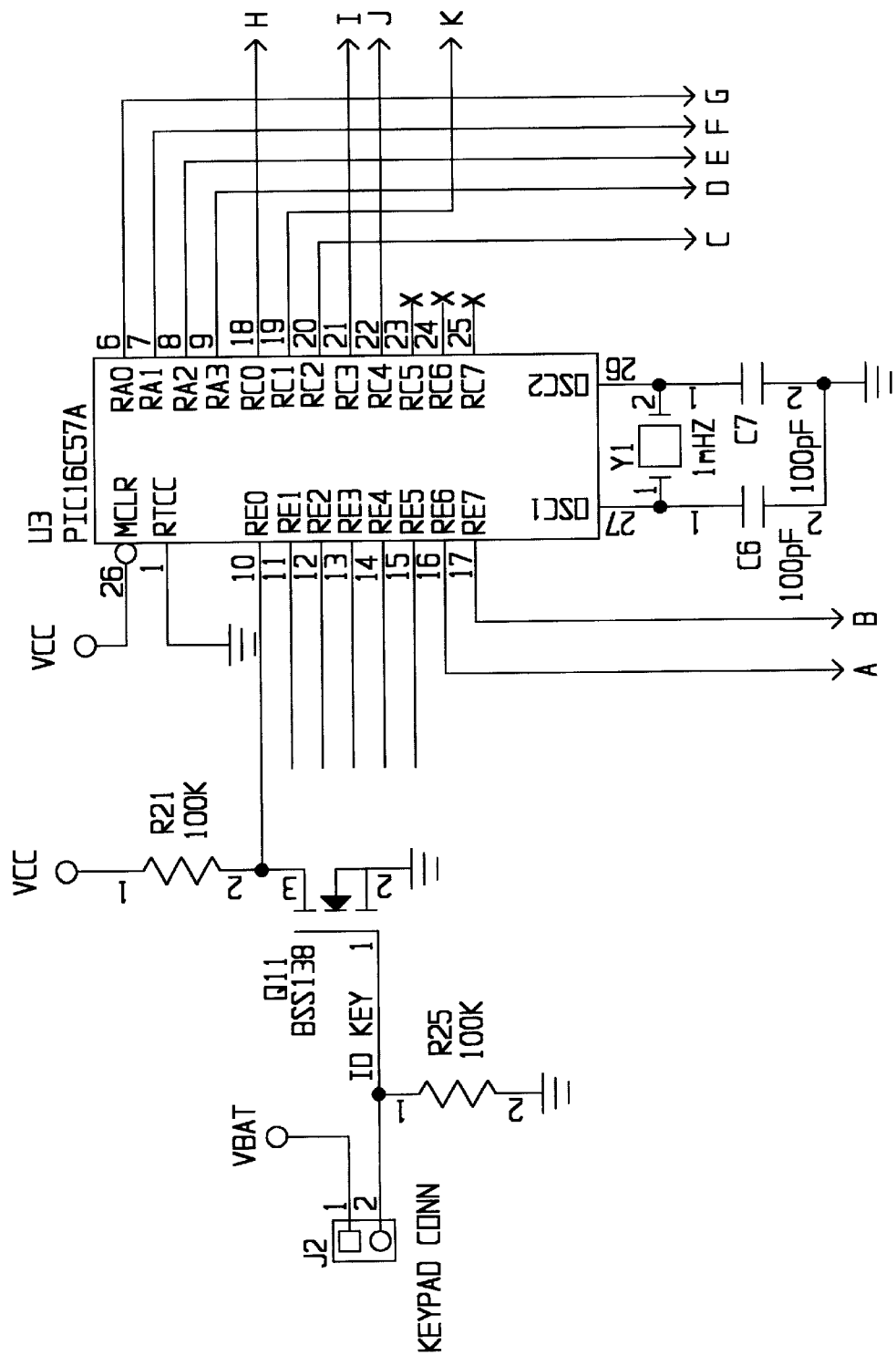
Figures 2, 11C:
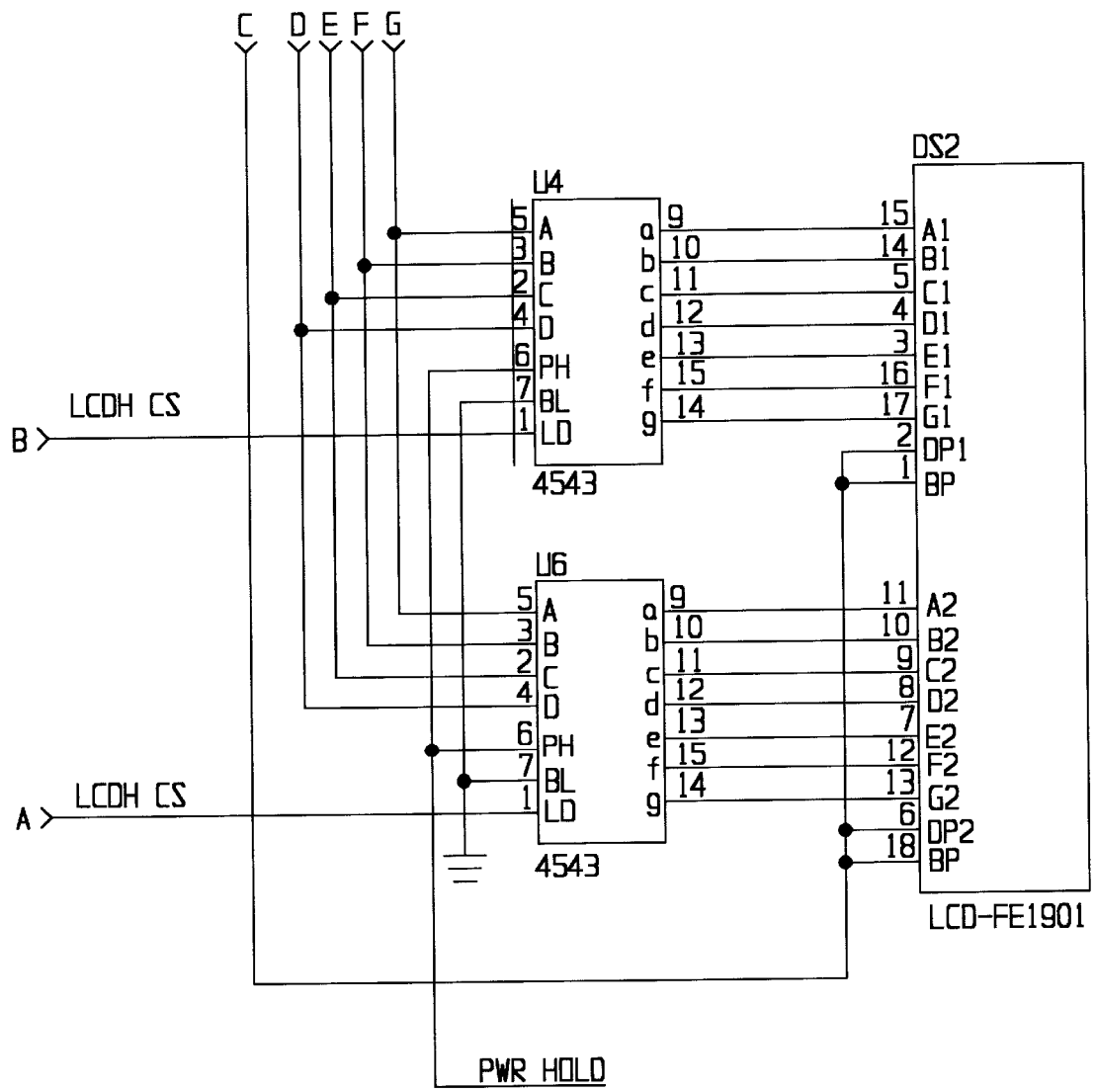
Figures 3, 11C:
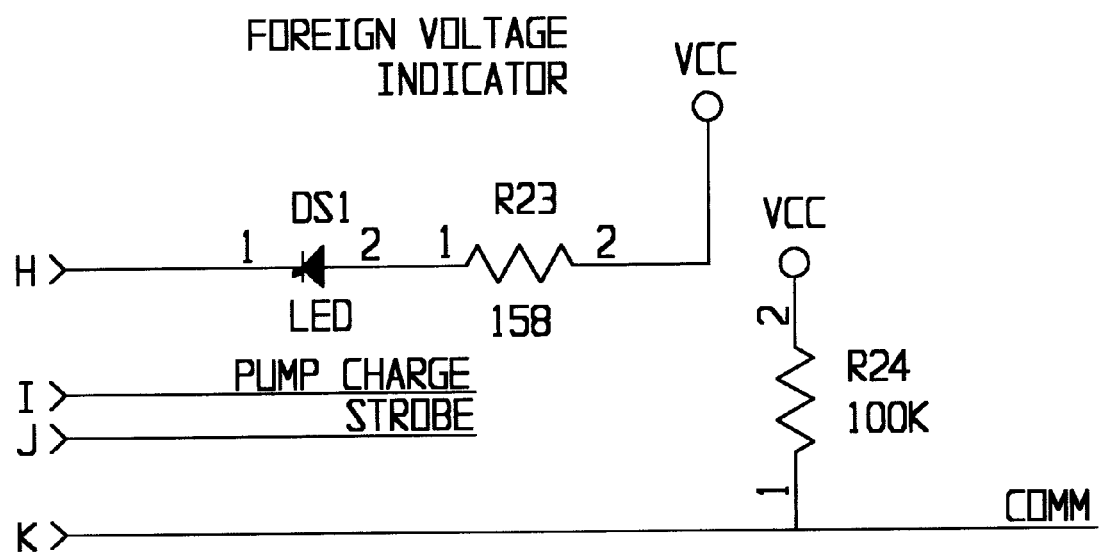
Figure 12:
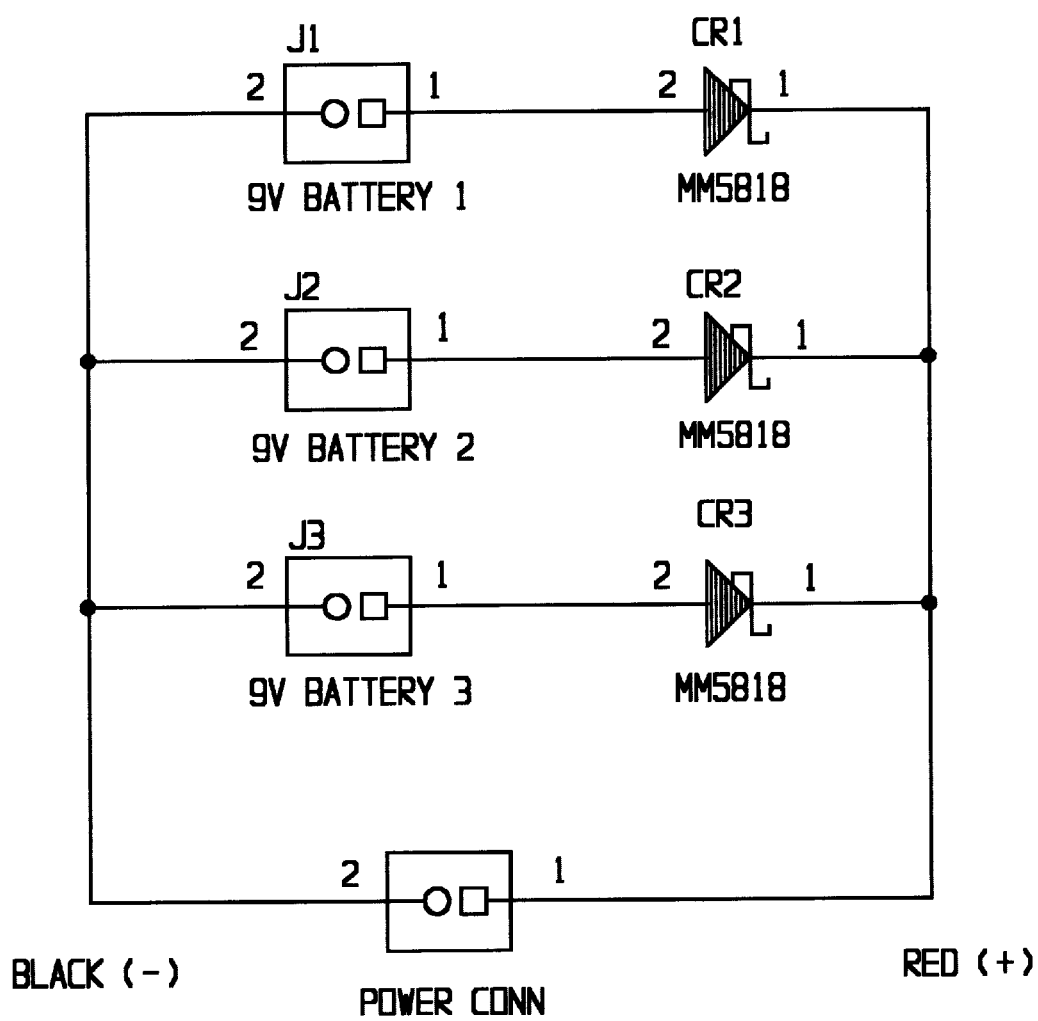
FIG. 12 is an electrical schematic of the battery pack.

Referring to FIGS. 1–3, an example of the preferred embodiment of the present invention is illustrated.

The present invention provides a cable continuity test system which generally comprises a test set unit 12 and at least one programmable terminator unit 14. The system preferably tests cables extending from a closet to a workstation or station. Each terminator is connected to the opposite end of the cable being tested. The two units establish a communications link if any two conductors have continuity from the closet end to the station end of the cable. Testing begins after a communication link is established.

The cable continuity test system is completely automatic and can, for example, perform a complete standard continuity test of a single four-pair cable in approximately one second. The system detects a live line, i.e. power on any two conductors), and also detects opens, shorts, reversals, crosses, and split pairs. Additionally, the system can detect the wiremap configuration on the workstation end of the cable. The test results can be viewed on several different test result screens and can be stored in memory for later retrieval.

The system preferably further includes a menu-driven software within the test set unit which allows a user to test and save a number of sites, to select a station wiremap, to select the test set end, to select a cable view, and to rate whether the cable passed the test or failed. The system can display the status of each conductor in the cable and shows a wire map in all cases. The test results can be uploaded to a data manager software 16 in a personal computer for further processing, reporting and archiving.

The communication mechanism used is a constant current source that is interrupted by the terminator. The current source has the advantage of reducing the effects of cable capacitance. The terminator returns the following data: the presence of current on a per-pin basis, the direction of that current, the programmable ID number, and the revision level of the terminator to handle future revisions properly.

The split pair detection mechanism uses very fast edge rate square waves applied to a pair that is not known to be incorrectly wired. If the pairs are paired correctly, there will be negligible crosstalk on the adjacent wires. If it is not paired correctly, there will be dramatic crosstalk on the other wires in the four pair cable. The square wave provides the high frequency content required to create the cross talk, since it is frequency dependent with greater coupling at higher frequencies. The detected signal is then captured with a high speed peak detector allowing rapid determination of the split pair.

The cable continuity test system is further described and/or shown in the attached Appendices which are hereby incorporated by reference as part of the specification. Appendix A is a brochure; Appendix B is a System Overview written by Jeffrey A. Deming; Appendix C is a copy of a User's Manual for the present invention; Appendix D is an Overview of the Data Manager Software; Appendix E is electrical schematics for the test set unit; Appendix F is an electrical schematic for the programmable terminator unit; Appendix G is an electrical schematic of the batter pack; and Appendix H is a copy of U.S. Pat. 4,703,497 which is assigned to Applicants' assignee and has been incorporated by reference herein. Appendix I is a copy of a user's guide for the TEST-ALL IV®+Plus Data Manager.

The descriptions above and the accompanying materials should be interpreted in the illustrative and not the limited sense. While the invention has been disclosed in connection with the preferred embodiment or embodiments thereof, it should be understood that there may be other embodiments which fall within the scope of the invention.

What is claimed is:

1. A cable continuity test system, comprising:
   (a) a terminator unit electrically connected to a first side of a cable to be tested; and
   (b) a test set unit electrically connected to a second side of said cable, said test set unit including display, and further including a microprocessor adapted for performing standard cable continuity tests, wherein said cable continuity tests includes a communication protocol between said test unit and said terminator, said communication protocol including:
      (a) current presence per pin;
      (b) current direction per pin;
   (c) revision number; and (d) programmable terminator ID.

2. The cable continuity test system of claim 1, wherein said terminator unit and said test unit are adapted to be operably connected to either a work station end or a test set end of said cable.

3. The cable continuity test system of claim 2, wherein said terminator unit and said test unit are adapted to be operably connected to either a work station end or a test set end of said cable using software rather than additional adapters.

4. The cable continuity test system of claim 1, wherein said test set unit stores records for each site tested with a time and date stamp.

5. The cable continuity test system of claim 4, wherein said test unit stores up to 500 records.

6. The cable continuity test system of claim 4, wherein said test unit uploads records to a data manager software program in a personal computer.

7. The cable continuity test system of claim 1, wherein said terminator unit is a programmable unit.

8. The cable continuity test system of claim 7, wherein said programmable unit is programmable with a unique terminator ID between the numbers of 00 and 99, said unique terminator ID being stored.

9. The cable continuity test system of claim 1, wherein said terminator unit and said test unit are adapted to perform standard continuity tests on cables extending up to two miles in length.

10. The cable continuity test system of claim 1, wherein said test unit identifies and displays wire mapping information for T568A, T568B, USOC 3, USOC 4,10 BASE-T and TOKEN RING, said wire mapping information being stored.

11. The cable continuity test system of claim 1, wherein said communication protocol is an asynchronous serial data protocol.

* * * * *